US012745514B2

(12) United States Patent
Kida et al.

(10) Patent No.: US 12,745,514 B2
(45) Date of Patent: Sep. 22, 2026

(54) METHOD FOR MANUFACTURING DISPLAY DEVICE AND DISPLAY DEVICE

(71) Applicant: SHARP KABUSHIKI KAISHA, Sakai City (JP)

(72) Inventors: Sentaro Kida, Sakai City (JP); Jun Sakuma, Sakai City (JP); Yasushi Asaoka, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 344 days.

(21) Appl. No.: 18/287,425

(22) PCT Filed: May 27, 2021

(86) PCT No.: PCT/JP2021/020103
§ 371 (c)(1),
(2) Date: Oct. 18, 2023

(87) PCT Pub. No.: WO2022/249370
PCT Pub. Date: Dec. 1, 2022

(65) Prior Publication Data
US 2024/0206215 A1 Jun. 20, 2024

(51) Int. Cl.
*H10K 59/122* (2023.01)
*H10K 50/115* (2023.01)
(Continued)

(52) U.S. Cl.
CPC ......... *H10K 59/122* (2023.02); *H10K 50/115* (2023.02); *H10K 50/13* (2023.02);
(Continued)

(58) Field of Classification Search
CPC ............... H10K 59/122; H10K 59/131; H10K 59/1201; H10K 50/13; H10K 50/115; H10K 71/221
(Continued)

(56) References Cited

U.S. PATENT DOCUMENTS 7,534,557 B2 * 5/2009 Tachikawa ........... H10K 71/233 445/24
8,043,793 B2 * 10/2011 Iizumi .................... H05B 33/10 430/311
(Continued)

FOREIGN PATENT DOCUMENTS

CN 109920826 A 6/2019
JP 2004-134150 A 4/2004
(Continued)

*Primary Examiner* — Tu-Tu V Ho
(74) *Attorney, Agent, or Firm* — ScienBiziP, P.C.

(57) ABSTRACT

A method for manufacturing a display device includes the following: a) forming a first resist layer over a substrate; b) patterning the first resist layer by removing the first resist layer formed over a first region of the substrate; c) forming a first light-emitting material layer over the first resist layer patterned, and above the first region of the substrate with the first resist layer removed; d) forming a second resist layer over the first light-emitting material layer; e) patterning the second resist layer by removing the first resist layer formed over a second region of the substrate, followed by lifting off the first light-emitting material layer and the second resist layer formed over the first resist layer over the second region; and f) forming a second light-emitting material layer over the second resist layer patterned, and above the second region of the substrate with the first resist layer removed.

20 Claims, 41 Drawing Sheets

(51) Int. Cl.
*H10K 50/13* (2023.01)
*H10K 59/12* (2023.01)
*H10K 59/131* (2023.01)
*H10K 71/20* (2023.01)

(52) U.S. Cl.
CPC ....... *H10K 59/1201* (2023.02); *H10K 59/131* (2023.02); *H10K 71/221* (2023.02)

(58) Field of Classification Search
USPC ........................................................... 257/40
See application file for complete search history.

(56) References Cited

U.S. PATENT DOCUMENTS 12,414,436 B2 * 9/2025 Asaoka ................ H10H 20/857
2009/0087792 A1 4/2009 Izumi et al.
2013/0075768 A1 3/2013 Kim et al.
2016/0181532 A1 6/2016 Ando et al.
2018/0309060 A1 10/2018 Ando et al.
2019/0334088 A1 10/2019 Ando et al.
2021/0408177 A1 12/2021 Fan et al.

FOREIGN PATENT DOCUMENTS

JP 2009-087760 A 4/2009
WO 2015/041053 A1 3/2015

* cited by examiner

FIG. 6D
41b
34a
41a
33
37
30
32(32A)
32(32B)
30A
30B
FIG. 6E
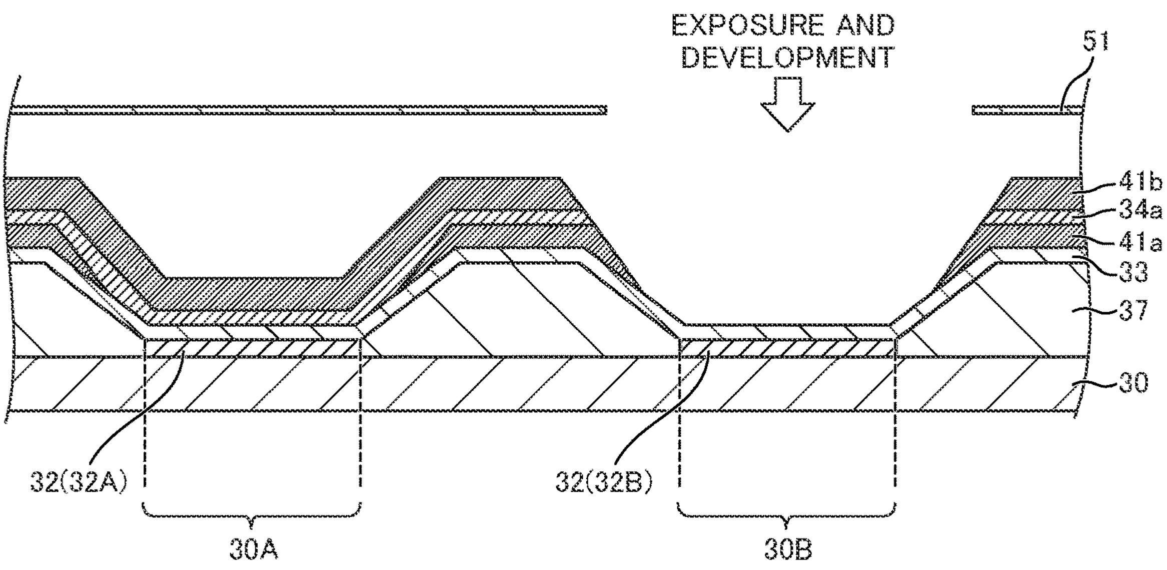
FIG. 6F
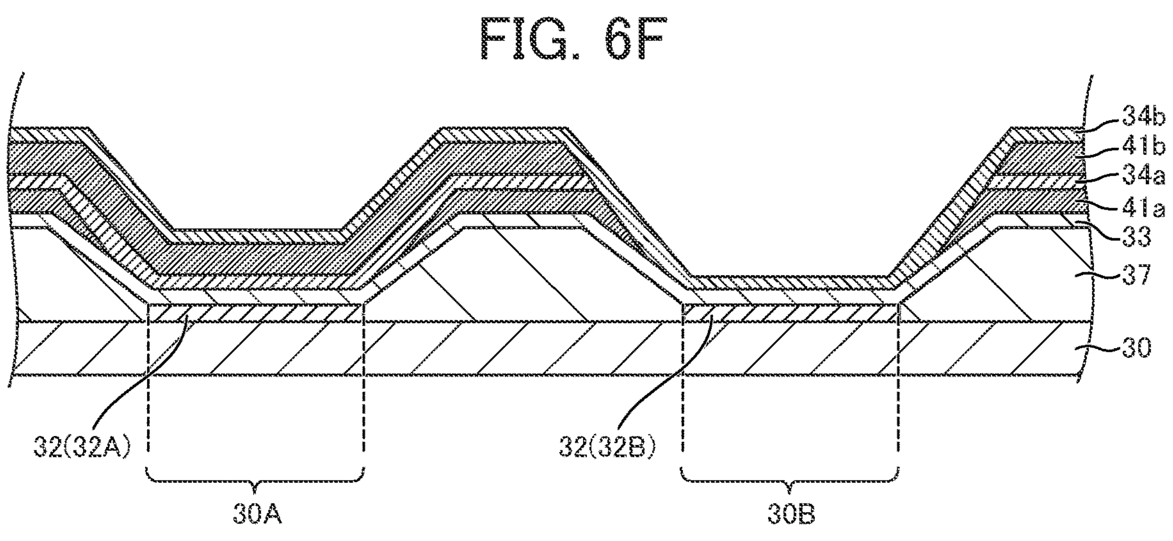

EXPOSURE AND DEVELOPMENT
51
41c
34b
41b
34a
41a
33
37
30
30C
30B
30A
32(32C)
32(32B)
32(32A)

34c
41c
34b
41b
34a
41a
33
37
30
30C
30B
30A
32(32C)
32(32B)
32(32A)

34c
41c
34b
41b
34a
41a
33
37
30
34C
30C
32(32C)
34B
30B
32(32B)
34A
30A
32(32A)
34c
34b
34a 41c
41b
41a
33
37
30
34C
30C
32(32C)
34B
30B
32(32B)
34A
41b
30A
32(32A)
34c
34b
34c

FIG. 17D
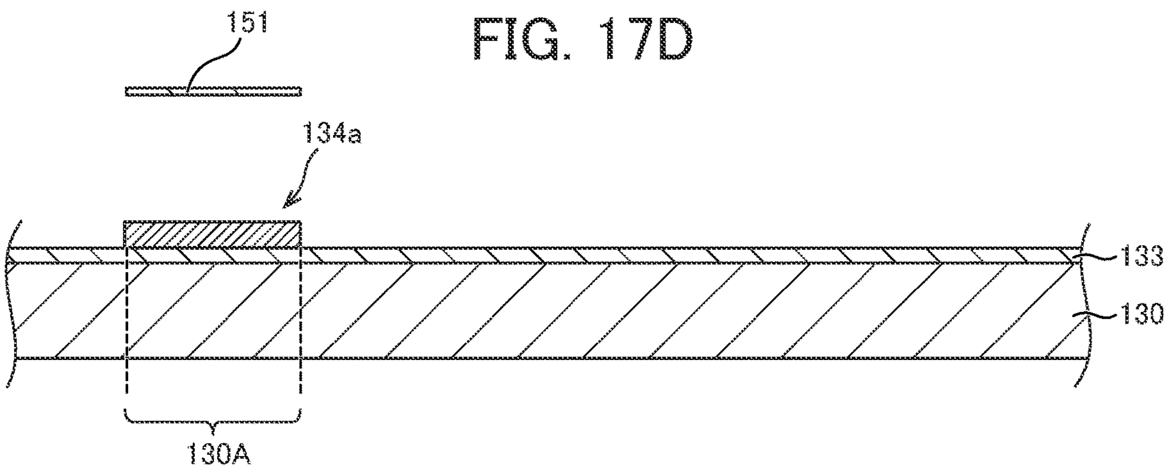
FIG. 17E
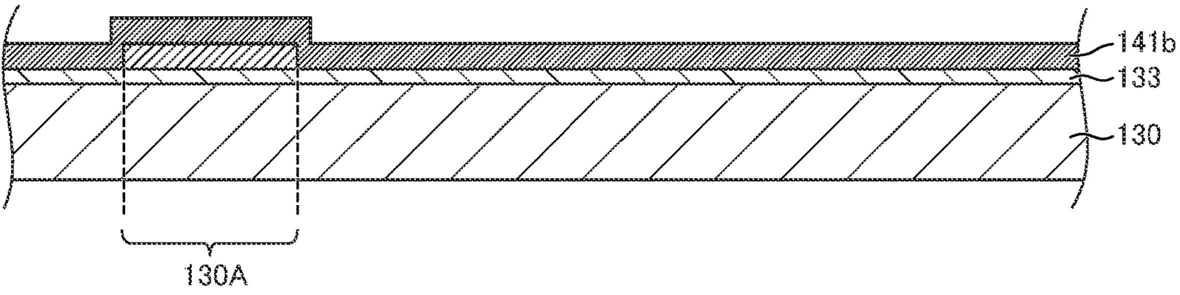
FIG. 17F
EXPOSURE AND DEVELOPMENT
151
141b
133
130
130A
130B 100
31
36
35
30
34C
39C
30C
32(32C)
37
34B
39B
30B
32(32B)
34A
39A
30A
32(32A)

FIG. 21J

EXPOSURE AND DEVELOPMENT 51
41c
34b
39b
41b
34a
39a
41a
37
30
30C
32(32C)
30B
32(32B)
30A
32(32A)

34c
39c
41c
34b
39b
41b
34a
39a
41a
37
30
30C
30B
30A
32(32C)
32(32B)
32(32A)

100
34C
39C
30
30C
32(32C)
37
34B
39B
30B
32(32B)
34A
39A
30A
32(32A)

METHOD FOR MANUFACTURING DISPLAY DEVICE AND DISPLAY DEVICE

TECHNICAL FIELD

The disclosure relates to a method for manufacturing a display device, and a display device.

BACKGROUND ART

Japanese Unexamined Patent Application Publication No. 2009-87760 discloses a step of forming an EL element including forming light-emitting layers of N-colors (N is an integer equal to or greater than two) in a pattern manner through liftoff, and including steps 1) to 4) below.

That is, this formation step disclosed in Japanese Unexamined Patent Application Publication No. 2009-87760 includes the following steps: 1) forming a first-color photoresist layer over a substrate with a first electrode layer formed; 2) patterning the first-color photoresist layer in such a manner that the first-color photoresist layer in a first-color light-emitting region is removed; 3) forming a first-color light-emitting layer by applying a coating liquid for forming the first-color light-emitting layer over the substrate with the first-color photoresist layer formed in a pattern manner; and 4) patterning the first-color light-emitting layer by removing the remaining first-color photoresist layer, and lifting off the first-color light-emitting layer over the first-color photoresist layer. Steps 1) to 4) are repeatedly performed in accordance with the number of colors of light-emitting layers.

The manufacturing method disclosed in Patent Literature 1 enables a light-emitting layer to be patterned stably through the foregoing liftoff.

SUMMARY

Technical Problem

However, Japanese Unexamined Patent Application Publication No. 2009-87760, which requires liftoff including foregoing steps 1) to 4) to be repeated for each color of the light-emitting layer, involves a lot of manufacturing process steps.

The present disclosure aims to provide a method for manufacturing a display device that can reduce the number of manufacturing process steps necessary for forming a plurality of light-emitting layers through liftoff.

Solution to Problem

A method for manufacturing a display device according to one aspect of the present disclosure includes the following steps: a) forming a first resist layer over a substrate; b) patterning the first resist layer by removing, through exposure and development, the first resist layer formed over a first region of the substrate; c) forming a first light-emitting material layer over the first resist layer patterned, and above the first region of the substrate with the first resist layer removed; d) forming a second resist layer over the first light-emitting material layer; e) patterning the second resist layer by removing, through exposure and development, the first resist layer formed over a second region of the substrate, followed by lifting off the first light-emitting material layer and the second resist layer formed over the first resist layer over the second region; and f) forming a second light-emitting material layer over the second resist layer patterned, and above the second region of the substrate with the first resist layer removed.

A display device according to one aspect of the present disclosure includes the following: a plurality of pixel electrodes disposed in correspondence with a plurality of subpixel formation regions; a first common charge transport layer provided over the plurality of pixel electrodes; a first light-emitting layer and a second light-emitting layer each provided, over the first common charge transport layer, in a location facing a corresponding one of the plurality of pixel electrodes; a bank provided upright so as to define the ends of light-emitting regions where light is emitted in the respective first and second light-emitting layers; a common electrode provided over both of the first light-emitting layer and the second light-emitting layer, the first common charge transport layer and the common electrode being disposed over the bank; and a resist layer provided in a location overlapping the bank in a plan view, and between the first common charge transport layer and the common electrode.

BRIEF DESCRIPTION OF DRAWINGS

FIG. 3 is a sectional view of the pixel taken along line III-III in FIG. 2.

FIG. 6D is a schematic sectional view of the intermediate product of the display device according to the first embodiment.

FIG. 6E is a schematic sectional view of the intermediate product of the display device according to the first embodiment.

FIG. 6F is a schematic sectional view of the intermediate product of the display device according to the first embodiment.

FIG. 17D is a schematic sectional view of the intermediate product of the display device according to the comparative example.

FIG. 17E is a schematic sectional view of the intermediate product of the display device according to the comparative example.

FIG. 17F is a schematic sectional view of the intermediate product of the display device according to the comparative example.

FIG. 21J is a schematic sectional view of the intermediate product of the display device according to the second embodiment.

DESCRIPTION OF EMBODIMENTS

Embodiments of the present disclosure and their modifications will be described with reference to the drawings. It is noted that components that are identical or correspond throughout the drawings will be hereinafter denoted by the same reference signs, and that the description of their redundancies will be omitted. Further, the following embodiments and their modifications are mere examples of the present disclosure, and the present disclosure is not limited to these embodiments and modifications. Other than these embodiments and modification, various modifications can be devised depending on design and other things, without departing from the technical idea of the present disclosure.

It is noted that the term "in the same layer" hereinafter means that one layer is formed in the same process step (film formation step) as another layer, that the term "under" hereinafter means that one layer is formed in a process step anterior to a process step of forming a comparative layer, and that the term "over" hereinafter means that one layer is formed in a process step posterior to a process step of forming a comparative layer.

First Embodiment

Display Device

Figure 1:
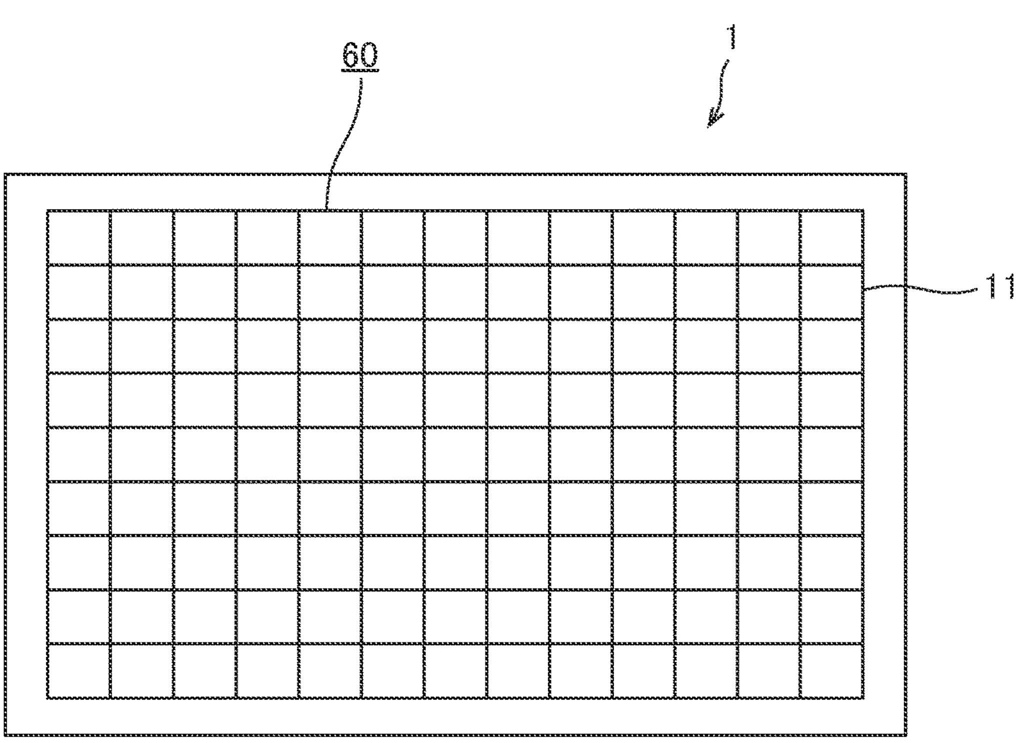
FIG. 1 is a schematic plan view of the configuration of a display region of a display device according to a first embodiment.

The configuration of a display device 1 according to a first embodiment will be described with reference to FIG. 1. FIG. 1 is a schematic plan view of the configuration of a display region 60 of the display device 1 according to the first embodiment. The display device 1 is, but not limited to, an organic EL display or a quantum-dot light-emitting diode (QLED) display. The following describes an instance where the display device 1 is a QLED display.

The display device 1 includes a plurality of pixels 11 in the display region 60 (effective display region), as illustrated in FIG. 1. The plurality of pixels 11 are arranged in matrix in the display region 60.

Figure 2:
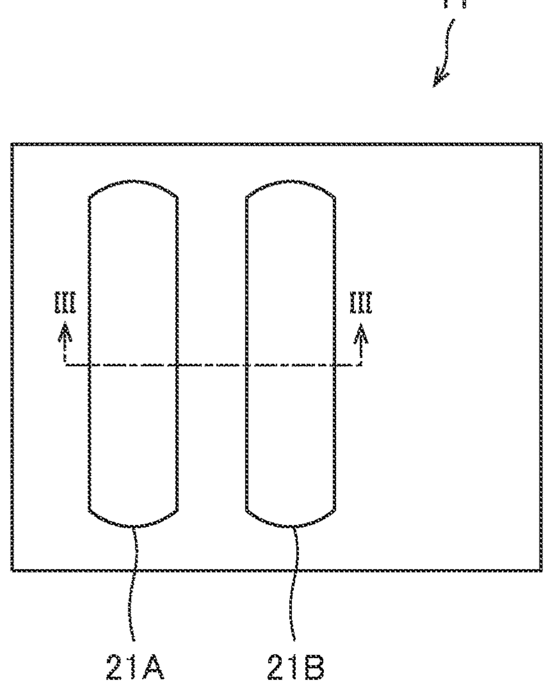
FIG. 2 is a schematic plan view of a pixel included in the display device according to the first embodiment.

Each pixel 11 is composed of a first subpixel 21A and a second subpixel 21B, as illustrated in FIG. 2. FIG. 2 is a schematic plan view of the pixel 11 included in the display device 1 according to the first embodiment.

As illustrated in FIG. 2, the first subpixel 21A and second subpixel 21B in the display device 1 are disposed side by side in the side-to-side direction of the drawing sheet. In the example illustrated in FIG. 2, the first subpixel 21A and the second subpixel 21B are disposed side by side in the stated order. It is noted that the first subpixel 21A and the second subpixel 21B will be merely referred to as subpixels 21 unless there is a need to distinguish between them in particular.

Figure 3:
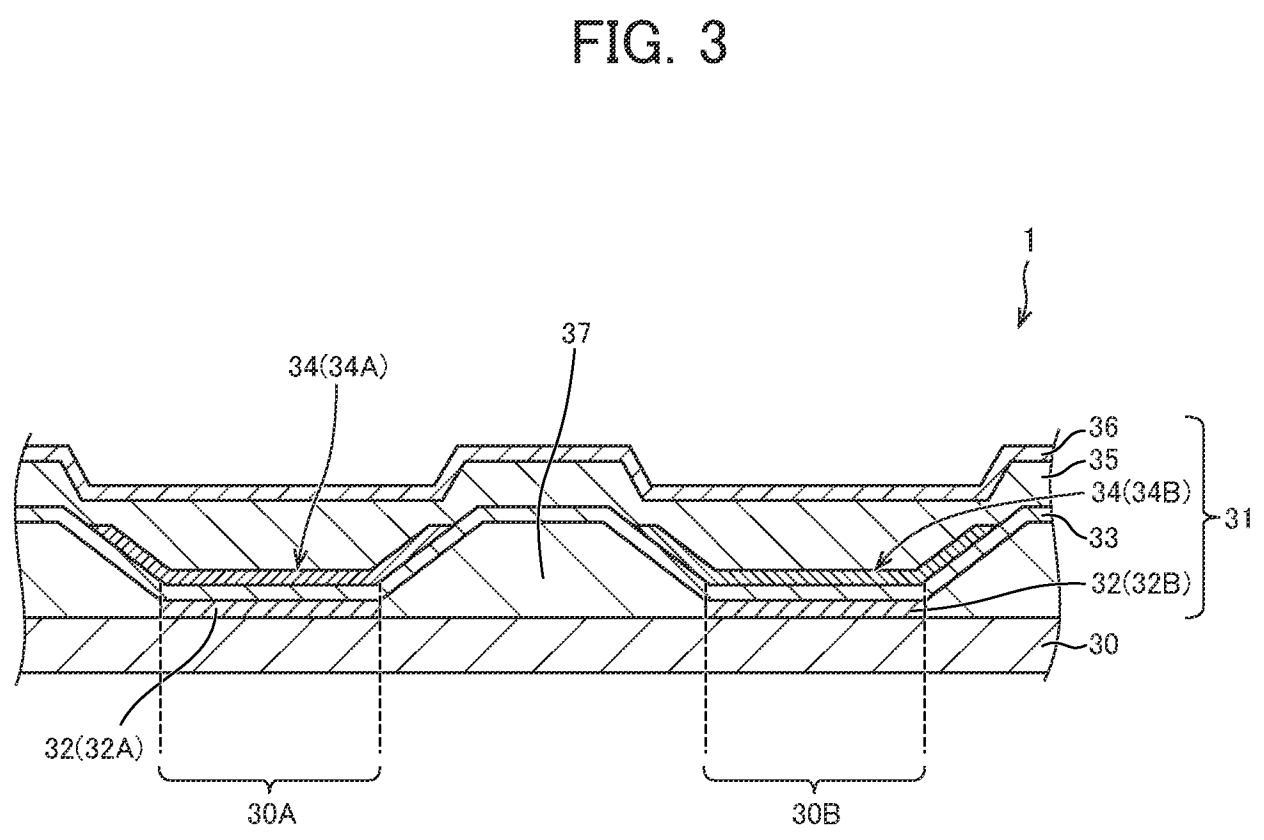

The sectional structure of the display region 60 where the pixels 11 are arranged in the display device 1 is the structure illustrated in FIG. 3. FIG. 3 is a schematic sectional view of the configuration of the display region 60 of the display device 1 according to the first embodiment. FIG. 3 is a sectional view of the pixel 11 taken along line III-III in FIG. 2.

That is, the display device 1 includes a substrate 30, a light-emitting element layer 31, and a bank 37, as illustrated in FIG. 3. The light-emitting element layer 31 includes pixel electrodes 32, a first common charge transport layer 33, light-emitting layers 34, a second common charge transport layer 35, and a common electrode 36. Moreover, the display device 1 is configured in such a manner that the light-emitting element layer 31 and the bank 37 are disposed over the substrate 30.

It is noted that although not shown particularly, the substrate 30 is composed of, for instance, a stack of a resin layer, a barrier layer, a thin-film transistor layer (TFT layer) and other components on a light-transparency support substrate. Moreover, the pixel electrodes 32 are electrically connected to thin-film transistors of the TFT layer via connecting conductors provided within contact holes not shown.

Each subpixel 21 is provided with one pixel electrode 32 and one light-emitting layer 34. In the Description, the pixel electrode 32 and light-emitting layer 34 corresponding to the first subpixel 21A will be referred to as a first pixel electrode 32A and a first light-emitting layer 34A. In addition, the pixel electrode 32 and light-emitting layer 34 corresponding to the second subpixel 21B will be referred to as a second pixel electrode 32B and a second light-emitting layer 34B.

It is noted that the first pixel electrode 32A and the second pixel electrode 32B are provided in locations facing the respective first light-emitting layer 34A and second light-emitting layer 34B. Moreover, a region of the substrate 30 where the first subpixel 21A is formed, and where the first pixel electrode 32A is provided will be referred to as a first region 30A. In addition, a region where the second subpixel 21B is formed, and where the second pixel electrode 32B is provided will be referred to as a second region 30B.

The first common charge transport layer 33, the second common charge transport layer 35, and the common electrode 36 are provided astride the first subpixel 21A and the second subpixel 21B.

To be specific, as illustrated in FIG. 3, a plurality of pixel electrodes 32 are provided over the substrate 30 for the respective subpixels 21, and the first common charge transport layer 33 is provided over the plurality of pixel electrodes 32. Furthermore, a plurality of light-emitting layers 34 are provided over the first common charge transport layer 33 so as to face the respective pixel electrodes 32 in plan view.

The perimeter of each light-emitting layer 34 is surrounded by the bank 37. The bank 37 is provided over the substrate 30 and has a sectional shape tapering down upward. The bank 37 is in the form of, for instance, squares so as to be able to individually section the plurality of pixels 11 arranged in matrix, and to be able to individually section the plurality of subpixels 21 constituting each pixel 11.

The second common charge transport layer 35 is provided over the plurality of light-emitting layers 34, and the common electrode 36 is provided over the second common charge transport layer 35.

It is noted that FIG. 3 illustrates, by way of example, that the light-emitting element layer 31 is composed of a stack of the pixel electrodes 32, first common charge transport layer 33, light-emitting layers 34, second common charge transport layer 35, and common electrode 36. For instance, the light-emitting element layer 31 may be composed of a first charge injection layer (not shown) provided between the pixel electrodes 32 and the first common charge transport layer 33 and composed of a second charge injection layer (not shown) provided between the second common charge transport layer 35 and the common electrode 36.

Further, the light-emitting element layer 31 does not necessarily have to include the first common charge transport layer 33 when the pixel electrodes 32 can inject electric charges into the light-emitting layers 34 appropriately. The light-emitting element layer 31 in this case is configured such that the pixel electrodes 32 are in direct contact with the light-emitting layers 34. Further, the light-emitting element layer 31 does not necessarily have to include the second common charge transport layer 35 when the common electrode 36 can inject electric charges into the light-emitting layers 34 appropriately. The light-emitting element layer 31 in this case is configured such that the common electrode 36 is in contact with and covers the light-emitting layers 34.

In the display device 1 having the foregoing configuration, upon potential difference being applied between the pixel electrode 32 and the common electrode 36, a first electric charge is injected from the pixel electrode 32 through the first common charge transport layer 33 into the light-emitting layer 34. In addition, a second electric charge is injected from the common electrode 36 through the second common charge transport layer 35 into the light-emitting layer 34. As a result, the first electric charge and the second electric charge recombine together in the light-emitting layer 34, and the light-emitting layer 34 emits light.

It is noted that the first electric charge in the display device 1 is an electron. It is also noted that the second electric charge is a hole. It is also noted that the pixel electrode 32 is a negative electrode. It is also noted that the common electrode 36 is a positive electrode. It is also noted that the first common charge transport layer 33 is an electron transport layer. It is also noted that the second common charge transport layer 33 is a hole transport layer.

Further, the display device 1 may have the following configuration. That is, the first electric charge is a hole. In addition, the second electric charge is an electron. In addition, the pixel electrode 32 is a positive electrode. In addition, the common electrode 36 is a negative electrode. In addition, the first common charge transport layer 33 is a hole transport layer. In addition, the second common charge transport layer 35 is an electron transport layer.

Material of Each Layer Constituting Light-Emitting Element Layer

The pixel electrodes 32 and the common electrode 36 are composed of a conductive material. The conductive material contains, for instance, at least one selected from the group consisting of a metal and a transparent conductive oxide. The metal includes, for instance, at least one selected from the group consisting of Al, Cu, Au, and Ag. The transparent conductive oxide includes, for instance, at least one selected from the group consisting of indium tin oxide (ITO), indium zinc oxide (IZO), zinc oxide (ZnO), aluminum zinc oxide (AZO), and boron zinc oxide (BZO). The pixel electrodes 32 and the common electrode 36 may be a single layer composed of one kind of a conductive material, or a stack of two or more layers composed of two or more mutually different kinds of conductive materials. The two or more layers may include both a layer made of metal and a layer made of transparent conductive oxide.

When the first common charge transport layer 33 or the second common charge transport layer 35 is an electron transport layer, the electron transport layer is composed of the following electron transport material. That is, the electron transport material contains, for instance, at least one selected from the group consisting of zinc oxide, titanium oxide, and strontium titanium oxide. Examples of the electron transport material containing zinc oxide include, but not limited to, ZnO, MgZnO, AlZnO, and LiZnO. In addition, an example of the electron transport material containing titanium oxide is, but not limited to, $TiO_2$. An example of the electron transport material containing strontium titanium oxide is, but not limited to, $SrTiO_3$. The electron transport material may be an electron transport material composed of one kind of a substance, or an electron transport material composed of a mixture of two or more kinds of substances.

On the other hand, when the first common charge transport layer 33 or the second common charge transport layer 35 is a hole transport layer, the hole transport layer is composed of the following hole transport material. That is, the hole transport material includes, for instance, at least one selected from the group consisting of an inorganic hole transport material and an organic hole transport material. The inorganic hole transport material includes, for instance, at least one selected from the group consisting of metal oxide, metal nitride, and metal carbide. The metal includes at least one selected from the group consisting of Zn, Cr, Ni, Ti, Nb, Al, Si, Mg, Ta, Hf, Zr, Y, La, W, Sr, and Mo. The organic hole transport material includes at least one selected from the group consisting of 4,4',4"-tris(9-carbazolyl)triphenylamine (TCTA), 4,4'-bis[N-(1-naphthyl)-N-phenyl-amino]-biphenyl (NPB), zinc phthalocyanine (ZnPC), di[4-(N,N-ditolylamino)phenyl]cyclohexane (TAPC), 4,4'-bis(carbazole-9-yl)biphenyl (CBP), 2,3,6,7,10,11-hexacyano-1,4,5,8,9,12-hexaazatriphenylene (HATCN), poly(N-vinylcarbazole) (PVK), poly(2,7-(9,9-di-n-octylfluorene)-(1,4-phenylene-((4-sec-butylphenyl)imino)-1,4-phenylene (TFB), a poly(triphenylamine) derivative (Poly-TPD), and poly(3,4-ethylenedioxythiophene)/poly(4-styrenesulfonic acid) (PEDOT-PSS). It is noted that the above listed materials are examples of the hole transport material, and the hole transport material is not limited to them. It is also noted that the hole transport material may be a hole transport material composed of one kind of a substance, or a hole transport material composed of a mixture of two or more kinds of substances.

The light-emitting layers 34 contain quantum dots as a light-emitting material. The quantum dots are, for instance, semiconductor fine particles each having a particle diameter of 100 nm or smaller. The semiconductor fine particles contain, for instance, at least one selected from the group consisting of a group II-VI compound, a group III-V compound, a group IV compound, and a group I-III-VI compound. The group II-VI compound includes, for instance, at least one selected from the group consisting of MgS, MgSe, MgTe, CaS, CaSe, CaTe, SrS, SrSe, SrTe, BaS, BaSe, BaTe, ZnS, ZnSe, ZnTe, CdS, CdSe, CdTe, HgS, HgSe, HgTe, ZnTeSe, and CdTeSe. The group III-V compound includes, for instance, at least one selected from the group consisting of GaAs, GaP, InN, InAs, InP, and InSb. The group IV compound includes, for instance, at least one selected from the group consisting of Si and Ge. Further, the group I-III-VI compound includes Ag—In—Ga—S and $Ag(In,Ga)Se_2$. The semiconductor fine particles may be semiconductor fine particles composed of these crystals, or semiconductor fine particles each having a core-shell structure having a core composed of the crystal, and a shell composed of a wide-bandgap shell material and overcoating the core.

Although the light-emitting layers 34 contain quantum dots, as described above, the light-emitting layers 34 may contain organic phosphors. Nevertheless, the light-emitting layers 34 containing quantum dots are more suitable, because this configuration can prevent damage that occurs in the light-emitting layers 34 when the light-emitting layers 34 are formed through exposure and development. That is, in a configuration where the light-emitting layers 34 contain organic phosphors, organic films are formed in the light-emitting layers 34. Thus, in subjecting the light-emitting layers 34 containing organic phosphors to development, a developing solution having a higher developing capability than that in the light-emitting layers 34 containing quantum dots needs to be used. For this reason, the light-emitting layers 34 containing organic phosphors are affected by the developing solution more strongly than the light-emitting layers 34 containing quantum dots, and greater damage possibly occurs in the light-emitting layers 34 containing organic phosphors.

Method for Forming Light-Emitting Element Layer

Figure 4:
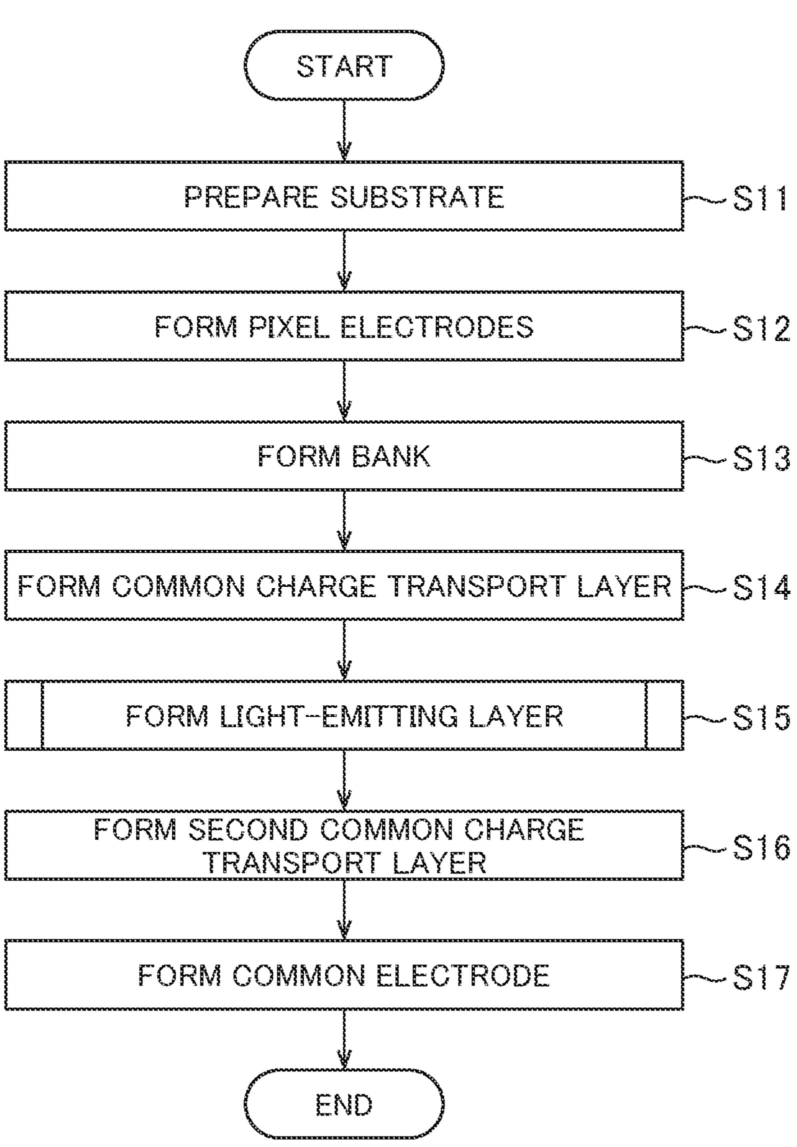
FIG. 4 is a flowchart showing a method for forming a light-emitting element layer included in the display device according to the first embodiment.

FIG. 4 is a flowchart showing a method for forming the light-emitting element layer 31 included in the display device 1 according to the first embodiment.

As show in FIG. 4, the first process step (Step S11) is preparing the substrate 30. The next (Step S12) is forming the pixel electrodes. That is, the plurality of pixel electrodes 32 are formed over the substrate 30. In this embodiment, the first region 30A, which is a region where the first light-emitting layer 34A is to be formed over the substrate 30, and the second region 30B, which is a region where the second light-emitting layer 34B is to be formed over the substrate 30, are defined in advance. The first pixel electrode 32A is provided over the first region 30A of the substrate 30. The second pixel electrode 32B is provided over the second region 30B of the substrate 30.

The next (Step S13) is forming the bank 37. The bank 37 is formed through, for instance, photolithography or evaporation so as to individually section the plurality of subpixels 21 constituting each pixel 11. To be specific, the bank 37 is provided over the substrate 30 so as to, in the plan view of the display device 1, surround the first pixel electrode 32A and second pixel electrode 32B formed over the substrate 30.

It is noted that to improve the detachability of resist layers 41, the angle formed by the side surface of the bank 37 and the main surface of the substrate 30 is preferably large. For instance, the angle formed by the side surface of the bank 37 and the main surface of the substrate 30 preferably ranges from 5 to 170 degrees inclusive.

The formation of the bank 37 is followed by a process step (Step S14) of forming the first common charge transport layer 33. That is, the first common charge transport layer 33 is formed, through evaporation or application, over the substrate 30 where the plurality of pixel electrodes 32 and the bank 37 disposed so as to surround each pixel electrode 32 are provided.

The next (Step S15) is forming the light-emitting layers 34. That is, the light-emitting layers 34 are formed, through liftoff for instance, over the first common charge transport layer 33 formed in Step S14. It is noted that a step of forming the light-emitting layers 34 will be detailed later on.

The next (Step S16) is forming the second common charge transport layer 35. That is, after the step of forming the light-emitting layers 34 is performed, the second common charge transport layer 35 is formed over the plurality of light-emitting layers 34 and the bank 37. The following (Step S17) is forming the common electrode 36 over the second common charge transport layer 35.

Through the foregoing process steps, the light-emitting element layer 31 included in the display device 1 according to the first embodiment can be formed over the substrate 30.

Step of Forming Light-Emitting Layers

Figure 5:
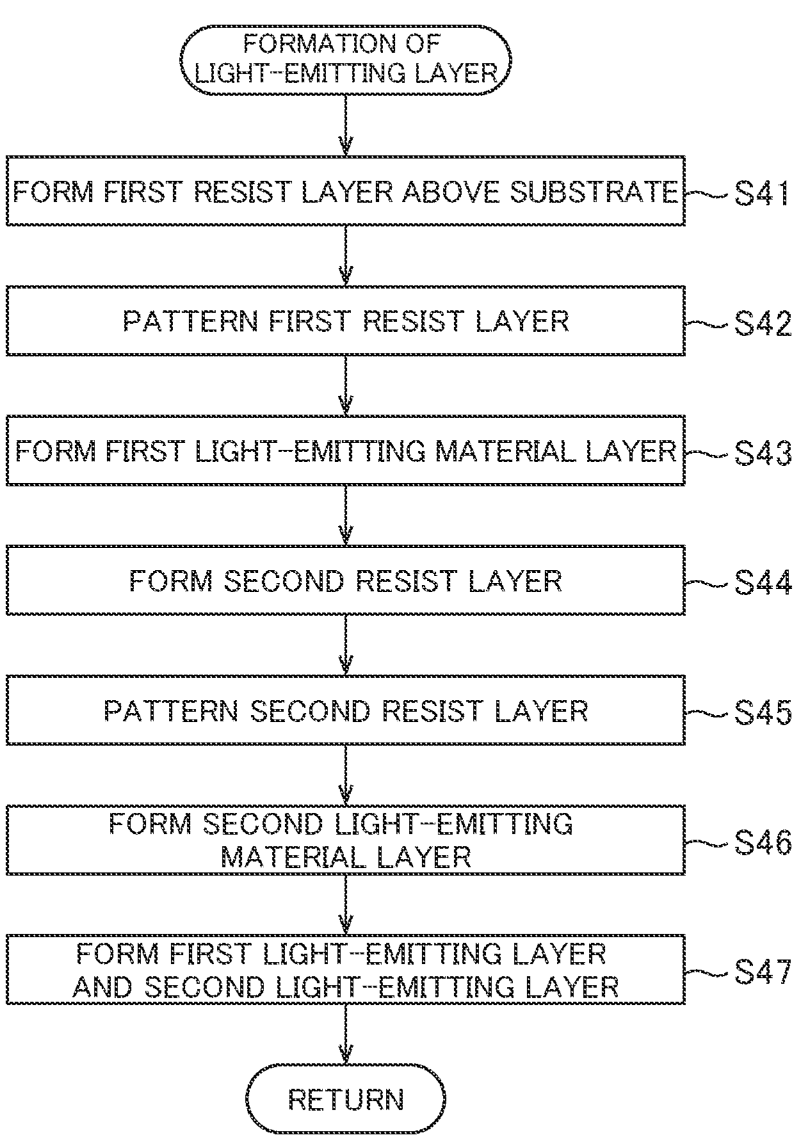
FIG. 5 is a flowchart showing an example step of forming light-emitting layers included in the display device according to the first embodiment.

Next, the step of forming the light-emitting layers 34 shown in Step S15 will be described with reference to FIG. 5 and FIG. 6A to FIG. 6H. FIG. 5 is a flowchart showing an example step of forming the light-emitting layers 34 included in the display device 1 according to the first embodiment. FIG. 6A to FIG. 6H are schematic sectional views of the intermediate product of the display device 1 according to the first embodiment.

It is noted that in some cases, a first resist layer 41*a*, a second resist layer 41*b*, and a third resist layer 41*c*, all of which are used in the step of forming the light-emitting layers 34 and will be described later on, will be merely referred to as resist layers 41 unless there is a need to distinguish between them in particular.

Figure 6A:
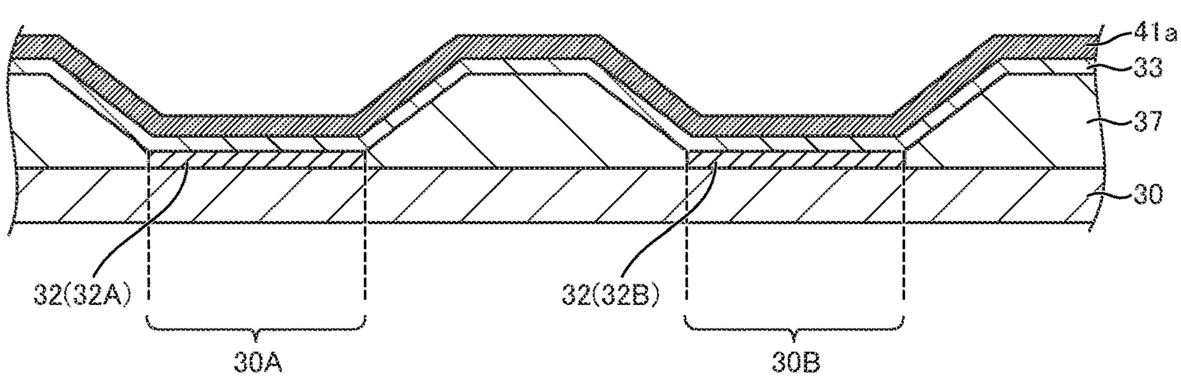
FIG. 6A is a schematic sectional view of the intermediate product of the display device according to the first embodiment.

As shown in FIG. 5 and FIG. 6A, the first process step (Step S41, step a)) is forming the first resist layer 41*a* by applying an insulating positive photoresist above the substrate 30, that is, over the first common charge transport layer 33.

Figure 6B:
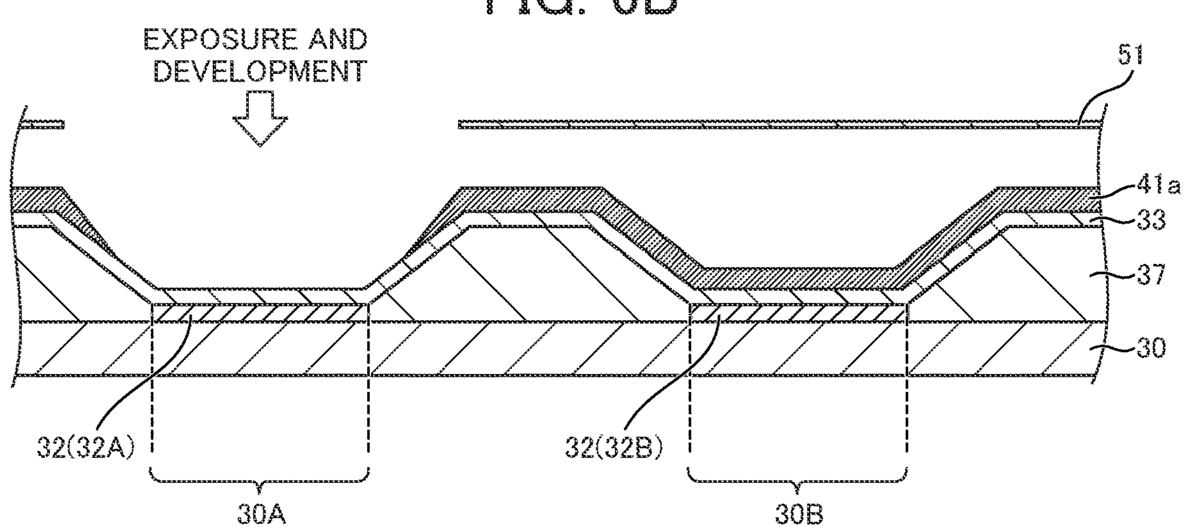
FIG. 6B is a schematic sectional view of the intermediate product of the display device according to the first embodiment.

As shown in FIG. 5 and FIG. 6B, the next (Step S42, step b)) is patterning the first resist layer 41*a* by removing, through exposure and development, the first resist layer 41*a* formed over the first region 30A of the substrate 30. That is, the first resist layer 41*a* undergoes exposure via a photomask 51 in such a manner that the first resist layer 41*a* corresponding to the first region 30A is removed. This process step is followed by development with a developing solution, and rinse. Through the foregoing process steps, the first resist layer 41*a* having a pattern shape with the portion corresponding to the first region 30A being removed is formed. It is noted that the development can be performed through, for instance, spray development, spin development, or ultrasonic development.

Figure 6C:
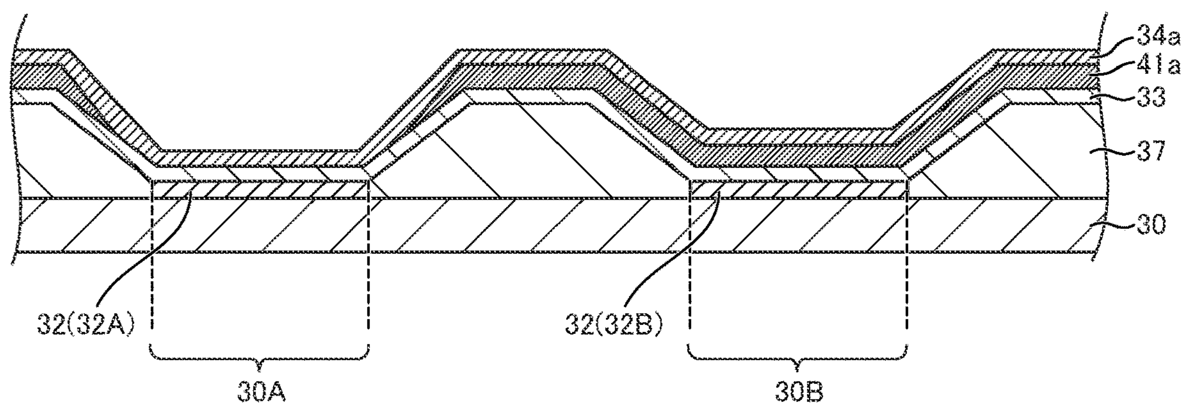
FIG. 6C is a schematic sectional view of the intermediate product of the display device according to the first embodiment.

As shown in FIG. 5 and FIG. 6C, the next (Step S43, step c)) is forming a first light-emitting material layer 34*a* over the substrate 30 with the first resist layer 41*a* of the foregoing pattern shape formed. That is, the first light-emitting material layer 34*a* is formed by applying a first light-emitting material containing quantum dots over the exposed first common charge transport layer 33 above the first region 30A of the substrate 30 with the first resist layer 41*a* removed, and over the patterned first resist layer 41*a*.

Through the foregoing process steps, the first light-emitting material layer 34*a* can be formed over the first common charge transport layer 33 above the first region 30A of the substrate 30. In the step of forming the light-emitting layers 34 in the present disclosure, a second light-emitting material layer 34*b* can be also stacked above the second region 30G of the substrate 30 by repeating process steps similar to foregoing Step S41 through Step S43.

To be specific, as shown in FIG. 5 and FIG. 6D through FIG. 6G, the second light-emitting material layer 34*b* is stacked over the first common charge transport layer 33 above the second region 30B of the substrate 30, and finally, the first light-emitting layer 34A and the second light-emitting layer 34B are formed.

That is, as shown in FIG. 5 and FIG. 6D, the second resist layer 41*b* is formed (Step S44, step d)) over the first light-emitting material layer 34*a* formed in the Step S43. That is, the second resist layer 41*b* is formed by applying an insulating positive photoresist over a location including portions corresponding to the respective first region 30A, second region 30B, and bank 37 on the first light-emitting material layer 34*a*.

Then, as shown in FIG. 5 and FIG. 6E, the first resist layer 41*a* formed over the second region 30B of the substrate 30 undergoes removal through exposure and development. The following (Step S45, step e)) is patterning the second resist layer 41*b* by lifting off the first light-emitting material layer 34*a* and second resist layer 41*b* formed over the first resist layer 41*a* that is removed.

That is, the first resist layer 41*a* undergoes exposure via the photomask 51 in such a manner that the first resist layer 41*a* corresponding to the second region 30B is removed. This process step is followed by development with a developing solution, and rinse. Through the foregoing process steps, the first resist layer 41*a* corresponding to the second region 30B is removed. Then, the first light-emitting material layer 34*a* and second resist layer 41*b* stacked over the first resist layer 41*a* that is removed undergo liftoff. Through the foregoing process steps, the second resist layer 41*b* having a pattern shape with the portion corresponding to the second region 30B being removed is formed.

It is noted that the first resist layer 41*a* and second resist layer 41*b* that are removed in the liftoff are formed so as to have an invertedly tapered shape tapering down toward the substrate 30. The shapes of the first resist layer 41*a* and second resist layer 41*b* that are removed in the liftoff are not limited to an invertedly tapered shape; they may be a forward tapered shape tapering down upwardly from the substrate 30. Nevertheless, an invertedly tapered shape in the resist layers 41 that are removed allows the developing solution to more easily extend to the first resist layer 41*a* and thus enables the first resist layer 41*a* to be more easily detached.

Step S45 is followed by a process step (Step S46, step f)) of forming the second light-emitting material layer 34*b* over the substrate 30 provided with the second resist layer 41*b* having a pattern shape with the portion corresponding to the second region 30B being removed. That is, as illustrated in FIG. 6F, the second light-emitting material layer 34*b* is formed by applying a second light-emitting material containing quantum dots over the exposed first common charge transport layer 33 above the second region 30B of the substrate 30 with the first resist layer 41*a* removed, and over the patterned second resist layer 41*b*.

Figure 6G:
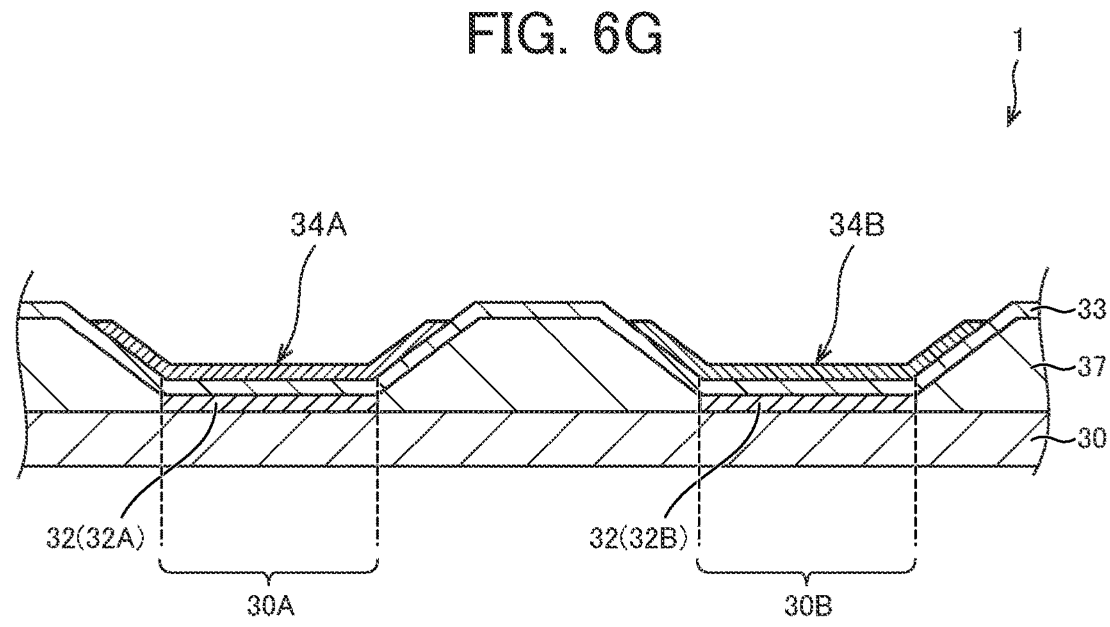
FIG. 6G is a schematic sectional view of the intermediate product of the display device according to the first embodiment.

As shown in FIG. 5 and FIG. 6G, the following is removing, through exposure and development, the second resist layer 41*b* formed over the first light-emitting material layer 34*a* located in correspondence with the first region 30A. The following is lifting off the second light-emitting material layer 34*b* formed over the second resist layer 41*b* that is removed, to produce the first light-emitting layer 34A that is the first light-emitting material layer 34*a* formed over the first region 30A, and to produce the second light-emitting layer 34B that is the second light-emitting material layer 34*b* formed over the second region 30B. The first light-emitting layer 34A and the second light-emitting layer 34B are formed in this way (Step S47, step g)).

In performing Step S47, as illustrated in FIG. 6G, the first resist layer 41*a* over the bank 37 undergoes removal through exposure and development, and the first light-emitting material layer 34*a*, second resist layer 41*b*, and second light-emitting material layer 34*b* formed above the bank 37 undergo liftoff.

It is noted that the development in Step S47 may be performed through organic-solvent development. The organic-solvent development does not necessarily require exposure. Further, even in the case of performing exposure, deterioration of the light-emitting layers 34 due to the exposure can be prevented.

Through the foregoing process steps, the first light-emitting layer 34A can be formed over the substrate 30 with the first pixel electrode 32A and first common charge transport layer 33 interposed therebetween. In addition, the second light-emitting layer 34B can be formed over the substrate 30 with the second pixel electrode 32B and first common charge transport layer 33 interposed therebetween.

It is noted that the stack of the first resist layer 41*a*, first light-emitting material layer 34*a*, second resist layer 41*b*, and second light-emitting material layer 34*b* over the bank 37 is removed in the step of forming the light-emitting layers 34. However, the stack may remain over the bank 37, as illustrated in FIG. 6H.

Figure 6H:
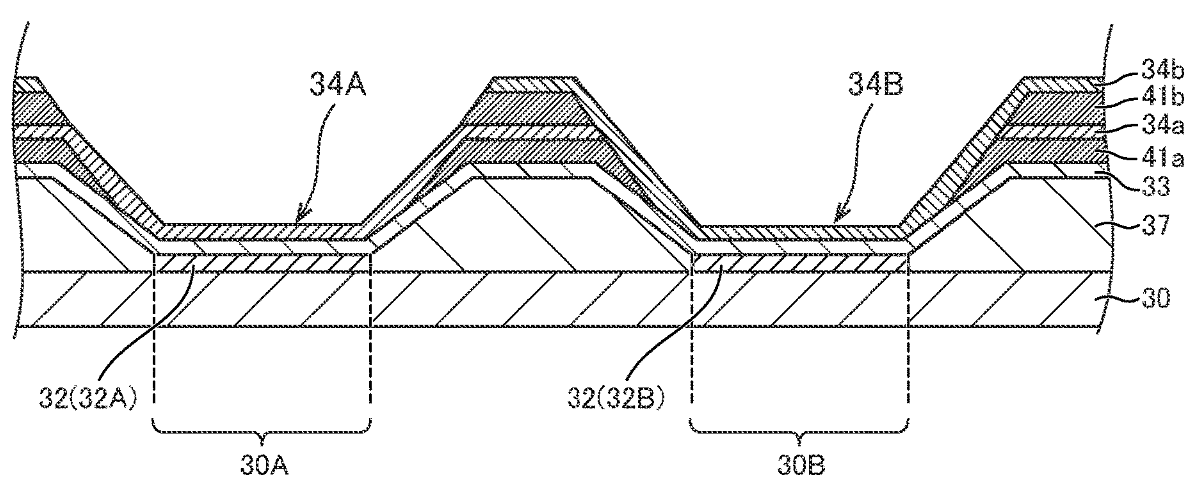
FIG. 6H is a schematic sectional view of the intermediate product of the display device according to the first embodiment.
Figure 7:
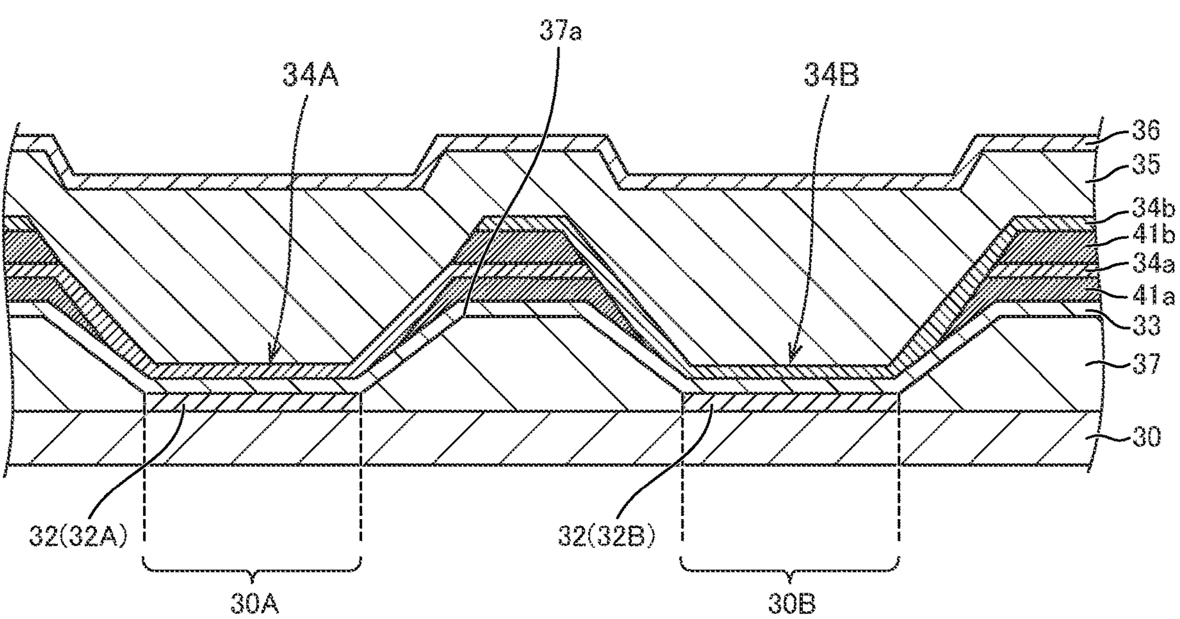
FIG. 7 is a schematic sectional view of the configuration of the display region of the display device according to the first embodiment.

When the light-emitting layers 34 are formed with the stack of the first resist layer 41*a*, first light-emitting material layer 34*a*, second resist layer 41*b*, and second light-emitting material layer 34*b* remaining over the bank 37, as illustrated in FIG. 6H, the pixels 11 of the display device 1 each have a sectional structure illustrated in FIG. 7. FIG. 7 is a schematic sectional view of the configuration of the display region 60 of the display device 1 according to the first embodiment. Like FIG. 3, FIG. 7 is a sectional view of the pixel 11 taken along line III-III in FIG. 2.

As illustrated in FIG. 7, the display region 60 of the display device 1 includes the first pixel electrode 32A and the second pixel electrode 32B respectively disposed in correspondence with the first region 30A and the second region 30B.

The first common charge transport layer 33 is provided over the first pixel electrode 32A and the second pixel electrode 32B. Furthermore, over the first common charge transport layer 33, the first light-emitting layer 34A is provided in a location facing the first pixel electrode 32A, and the second light-emitting layer 34B is provided in a location facing the second pixel electrode 32B. Further, the common electrode 36 is provided over both of the first light-emitting layer 34A and second light-emitting layer 34B with the second common charge transport layer 35 interposed therebetween.

Still furthermore, the bank 37 is formed so as to be provided upright from the substrate 30 so as to define the ends of light-emitting regions where light is emitted in the respective first light-emitting layer 34A and second light-emitting layer 34B.

The first common charge transport layer 33 and the common electrode 36 are disposed also over the bank 37. The first resist layer 41*a* and the second resist layer 41*b* remain formed between the first common charge transport layer 33 and common electrode 36 in a location overlapping the bank 37 in the plan view of the display device 1. That is, over the bank 37, the stack of, in sequence from the bottom to the top, the first resist layer 41*a*, first light-emitting material layer 34*a*, second resist layer 41*b*, and second light-emitting material layer 34*b* is formed between the first common charge transport layer 33 and the common electrode 36.

The stack including the first resist layer 41*a* and second resist layer 41*b* is formed over the bank 37 as described above, thereby enabling the distance between the first common charge transport layer 33 and common electrode 36 to be maintained over the bank 37. This can avoid a leakage current resulting from their approach.

Further, the first resist layer 41*a* is disposed between the first light-emitting material layer 34*a* and the first common charge transport layer 33, and the second resist layer 41*b* is disposed between the second light-emitting material layer 34*b* and the first light-emitting material layer 34*a*. This can avoid light emission resulting from leakage of a current flowed through the first common charge transport layer 33 into the first light-emitting material layer 34*a* or second light-emitting material layer 34*b* over the bank 37.

Still furthermore, the first resist layer 41*a* is stacked also over a shoulder 37*a* of the bank 37, as illustrated in FIG. 7. Here, the shoulder 37*a* of the bank 37 is a portion connecting the top side of the bank 37 and the side surface of the bank 37 together. The bank 37 tends to be thin at the shoulder 37*a*, and the distance between the first common charge transport layer 33 and common electrode 36 is thus short here. Accordingly, stacking the first resist layer 41*a* over the shoulder 37*a* of the bank 37 brings the first common charge transport layer 33 and common electrode 36 close to each other, thereby enabling a leakage current to be avoided.

Modification

It is noted that each pixel 11 in the display device 1 according to the first embodiment is composed of the first subpixel 21A and the second subpixel 21B, as illustrated in FIG. 2.

Figure 8:
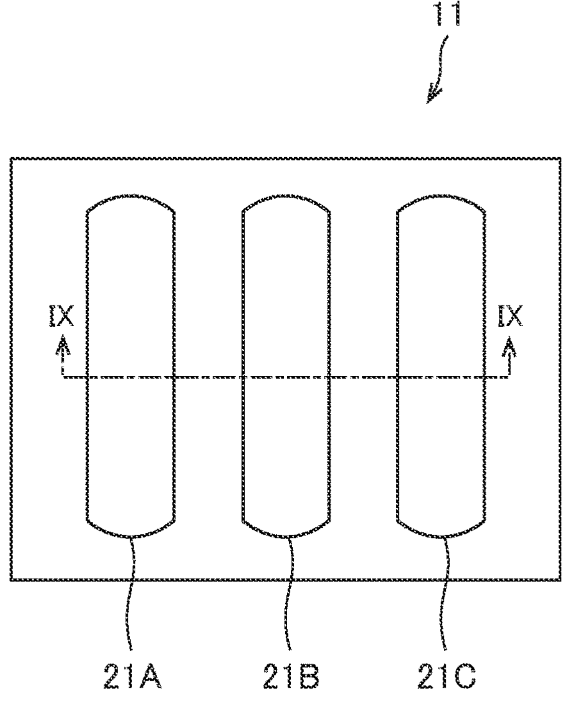
FIG. 8 is a schematic plan view of a pixel included in a display device according to a modification of the first embodiment.

However, the subpixels 21 constituting the pixel 11 are not limited to these two. For instance, the pixel 11 may be composed of the first subpixel 21A, the second subpixel 21B, and a third subpixel 21C, as illustrated in FIG. 8. FIG. 8 is a schematic plan view of the pixel 11 included in the display device 1 according to a modification of the first embodiment.

As illustrated in FIG. 8, the display device 1 according to the modification of the first embodiment is configured in such a manner that the first subpixel 21A, the second subpixel 21B, and the third subpixel 21C are disposed side by side in the side-to-side direction of the drawing sheet. In the example illustrated in FIG. 8, the first subpixel 21A, the second subpixel 21B, and the third subpixel 21C are disposed side by side in the stated order. It is noted that the first subpixel 21A, the second subpixel 21B, and the third subpixel 21C will be merely referred to as subpixels 21 unless there is a need to distinguish between them in particular. The first subpixel 21A, the second subpixel 21B, and the third subpixel 21C can be subpixels that respectively emit green light, red light, and blue light.

Figure 9:
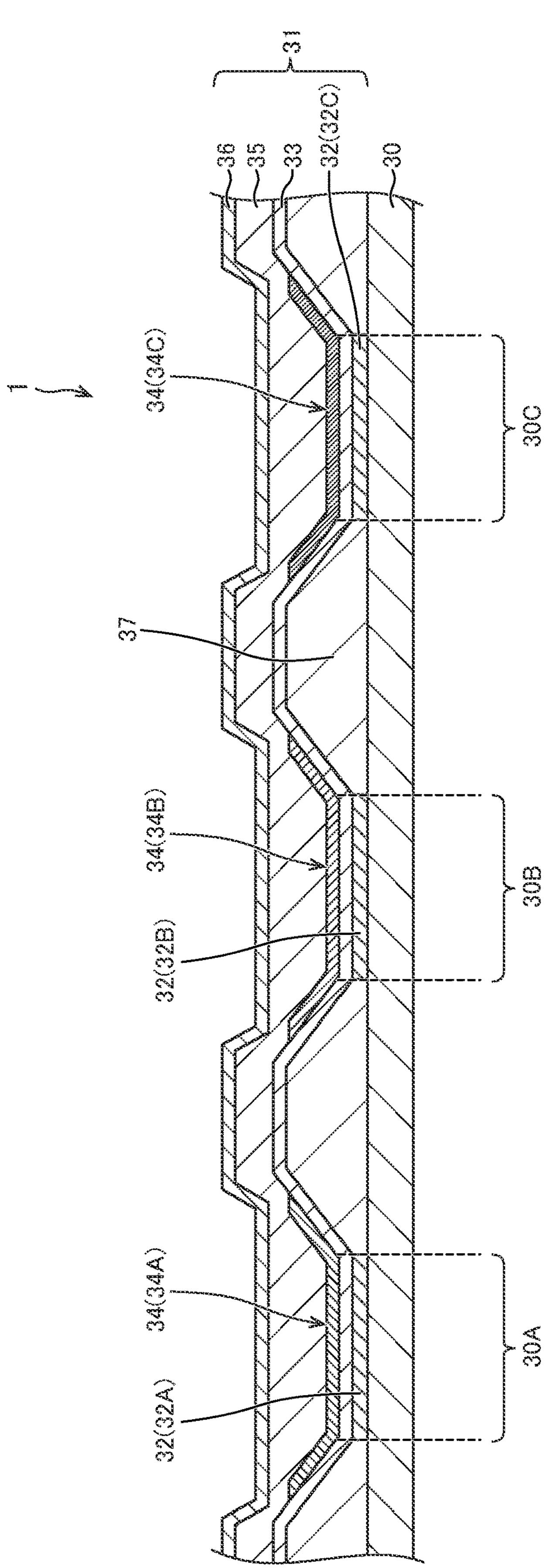
FIG. 9 is a sectional view of the pixel taken along line IX-IX in FIG. 8.

The sectional structure of the display region 60 where the pixels 11 are arranged in the display device 1 according to the modification is the structure illustrated in FIG. 9. FIG. 9 is a schematic sectional view of the configuration of the display region 60 of the display device 1 according to the modification of the first embodiment. FIG. 9 is a sectional view of the pixel 11 taken along line IX-IX in FIG. 8.

It is noted that in the Description, the pixel electrode 32 and light-emitting layer 34 corresponding to the third subpixel 21C will be referred to as a third pixel electrode 32C and a third light-emitting layer 34C. The third pixel electrode 32C is provided in a location facing the third light-emitting layer 34C. Moreover, a region of the substrate 30 where the third pixel electrode 32C is provided will be referred to as a third region 30C.

Step of Forming Light-Emitting Layers

The following describes a step of forming the first light-emitting layer 34A, the second light-emitting layer 34B, and the third light-emitting layer 34C, with reference to FIG. 10 and FIG. 11A to FIG. 11E.

Figure 10:
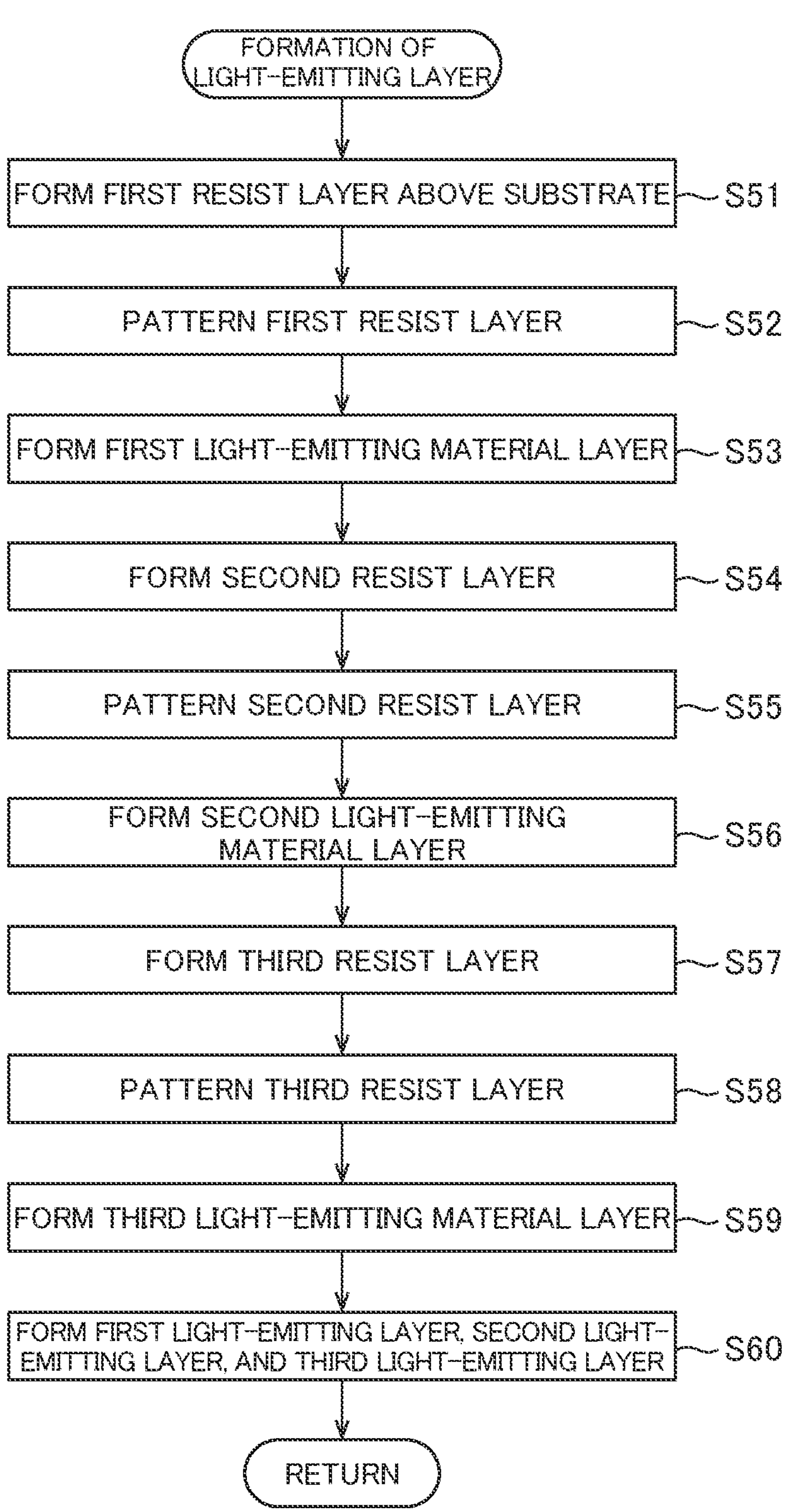
FIG. 10 is a flowchart showing an example step of forming light-emitting layers included in the display device according to the modification of the first embodiment.

FIG. 10 is a flowchart showing an example step of forming the light-emitting layers included in the display device 1 according to the modification of the first embodiment. FIG. 11A to FIG. 11E are schematic sectional views of the intermediate product of the display device 1 according to the modification of the first embodiment.

As shown in FIG. 10, the first process step (Step S51, step a)) is forming the first resist layer 41*a* above the substrate 30, that is, over the first common charge transport layer 33. That is, the first region 30A, which is a region where the first light-emitting layer 34A is to be formed over the substrate 30, the second region 30B, which is a region where the second light-emitting layer 34B is to be formed over the substrate 30, and the third region 30C, which is a region where the third light-emitting layer 34C is to be formed over the substrate 30, are defined in advance. The first pixel electrode 32A is provided directly above the first region 30A of the substrate 30. The second pixel electrode 32B is provided directly above the second region 30B of the substrate 30. The third pixel electrode 32C is provided directly above the third region 30C of the substrate 30. The first resist layer 41*a* is formed by applying an insulating positive photoresist over the first common charge transport layer 33 above a location including the first region 30A, second region 30B, and third region 30C.

It is noted that the subsequent processing in Step S52 through Step S56 (step b) through step f)), which is similar to the processing in Step S42 through Step S46 shown in FIG. 5, will not be described.

Figure 11A:
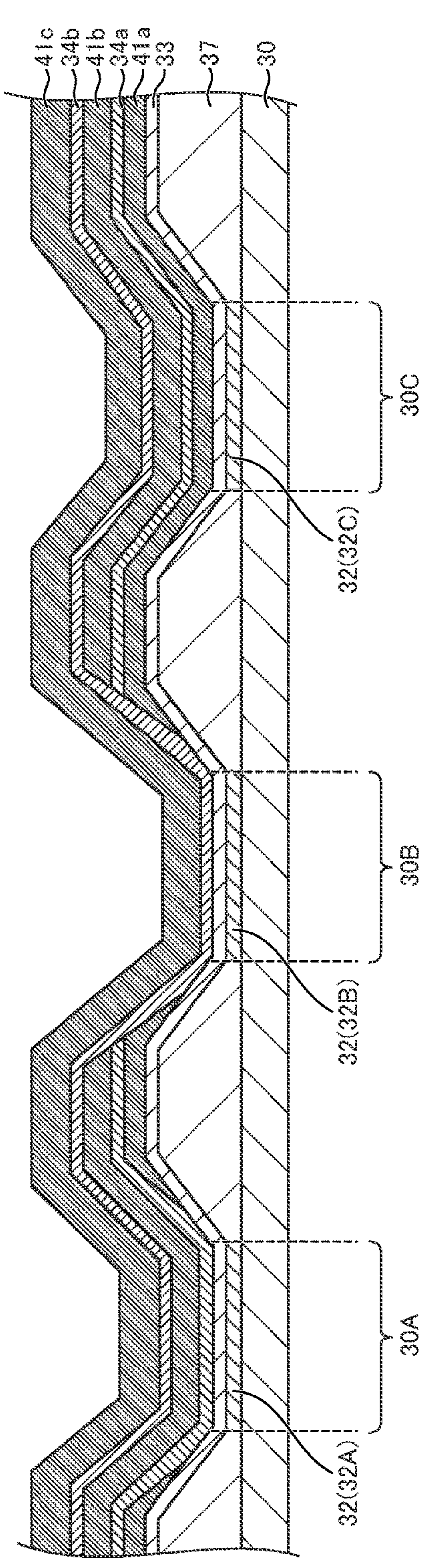
FIG. 11A is a schematic sectional view of the intermediate product of the display device according to the modification of the first embodiment.

In Step S56, the second light-emitting material layer 34*b* is formed over the exposed first common charge transport layer 33 above the second region 30B, and over the patterned second resist layer 41*b*. The formation of the second light-emitting material layer 34*b* is followed by a process step (Step S57, step h)) of forming the third resist layer 41*c* over the second light-emitting material layer 34*b*, as shown in FIG. 10 and FIG. 11A. That is, the third resist layer 41*c* is formed by applying an insulating positive photoresist over a location including portions corresponding to the respective first region 30A, second region 30B, third region 30C, and bank 37 on the second light-emitting material layer 34*b*.

Figure 11B:
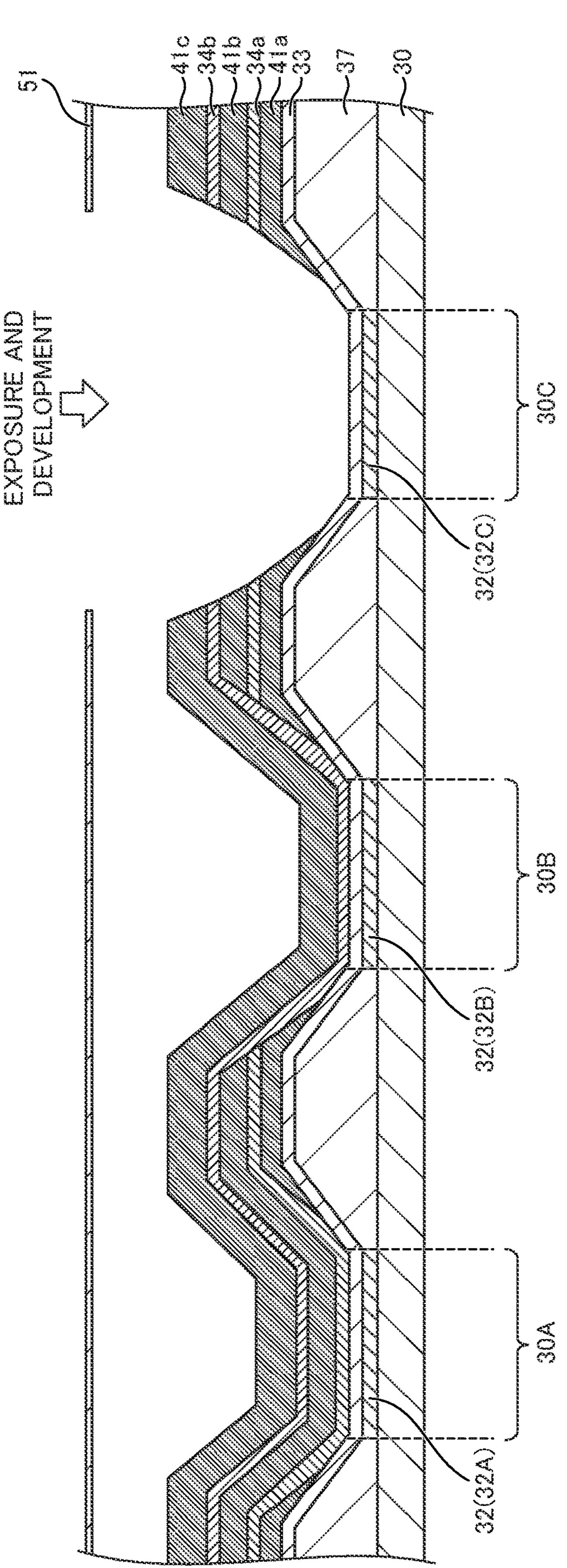
FIG. 11B is a schematic sectional view of the intermediate product of the display device according to the modification of the first embodiment.

As shown in FIG. 10 and FIG. 11B, the next is removing, through exposure and development, the first resist layer 41*a* formed over the third region 30C of the substrate 30. The following (Step S58, step i)) is patterning the third resist layer 41*c* by lifting off the first light-emitting material layer 34*a*, second resist layer 41*b*, second light-emitting material layer 34*b*, and third resist layer 41*c* formed over the third region 30C where the first resist layer 41*a* undergoes removal.

That is, the first resist layer 41*a* undergoes exposure via the photomask 51 in such a manner that the first resist layer 41*a* corresponding to the third region 30C is removed. This process step is followed by development with a developing solution, and rinse. The first resist layer 41*a* corresponding to the third region 30C is removed in this way. Then, the first light-emitting material layer 34*a*, second resist layer 41*b*, second light-emitting material layer 34*b*, and third resist layer 41*c* stacked over the first resist layer 41*a* that is removed undergo liftoff. Through the foregoing process steps, the third resist layer 41*c* having a pattern shape with the portion corresponding to the third region 30C being removed is formed.

It is noted that the first resist layer 41*a*, second resist layer 41*b*, and third resist layer 41*c* that are removed in the liftoff are formed so as to have an invertedly tapered shape tapering down toward the substrate 30. The shapes of the first resist layer 41*a*, second resist layer 41*b*, and third resist layer 41*c* that are removed in the liftoff are not limited to an invertedly tapered shape; they may be a forward tapered shape tapering down upwardly from the substrate 30. Nevertheless, an invertedly tapered shape in the resist layers 41 that are removed allows the developing solution to more easily extend to the first resist layer 41*a* and thus enables the first resist layer 41*a* to be more easily detached.

Further, each of the first resist layer 41*a*, second resist layer 41*b*, and third resist layer 41*c* can be several hundred nanometers in thickness. Further, the first resist layer 41*a*, the second resist layer 41*b*, and the third resist layer 41*c* are thicker in this order. In other words, the lower stacked resist layer 41 has a smaller thickness. This enables the stack including the first resist layer 41*a*, second resist layer 41*b*, and third resist layer 41*c* to be detached from the substrate 30 when the stack undergoes liftoff.

Further, a liquid-repellent layer containing a liquid-repellent ingredient may be formed on the individual upper surfaces of the first resist layer 41*a*, second resist layer 41*b*, and third resist layer 41*c*. An example of the liquid-repellent ingredient is a perfluoroalkyl compound. The liquid-repellent ingredient is preferably contained in the resist layers 41 at a ratio of 0.01 to 1.00 wt % inclusive. In particular, the ratio more desirably ranges from 0.1 to 1.00 wt % inclusive. It is noted that liquid repellency, to be more specific, is a property of repelling the solvent contained in the light-emitting material layers (the first light-emitting material layer 34*a*, the second light-emitting material layer 34*b*, and a third light-emitting material layer 34*c*).

For the resist layers 41 containing a liquid-repellent ingredient, the liquid-repellent ingredient moves toward the upper surfaces of the resist layers 41 when the resist layers 41 solidify. Accordingly, the resist layers 41 each include, near its upper surface, a liquid-repellent layer containing a high-concentration liquid-repellent ingredient. Further, the concentration of the liquid-repellent ingredient near the lower surface of each resist layer 41 is lower than that near its upper surface.

Such a configuration where each resist layer 41 contains a liquid-repellent ingredient can avoid the solvent of the light-emitting material layer stacked over the resist layer 41 from flowing toward the lower surface and thus can reduce the amount of the solvent contained in the light-emitting material layer. This configuration can also reduce the thickness of the resist layer 41 further than a resist layer containing no liquid-repellent ingredient and thus can facilitate layer removal through development.

The developing solution used in the development in Step S58 can be an alkaline developing solution having an alkali concentration that enables liftoff of the first light-emitting material layer 34*a*, second resist layer 41*b*, second light-emitting material layer 34*b*, and third resist layer 41*c* formed over the first resist layer 41*a* in the third region 30C. This developing solution may contain a surfactant. Usable examples of the surfactant include, but not limited to, an anionic surfactant and a non-ionic surfactant. Further, an organic solvent may be contained. Usable examples of the organic solvent include PGMA, PGME, and acetone, for example.

Figure 11C:
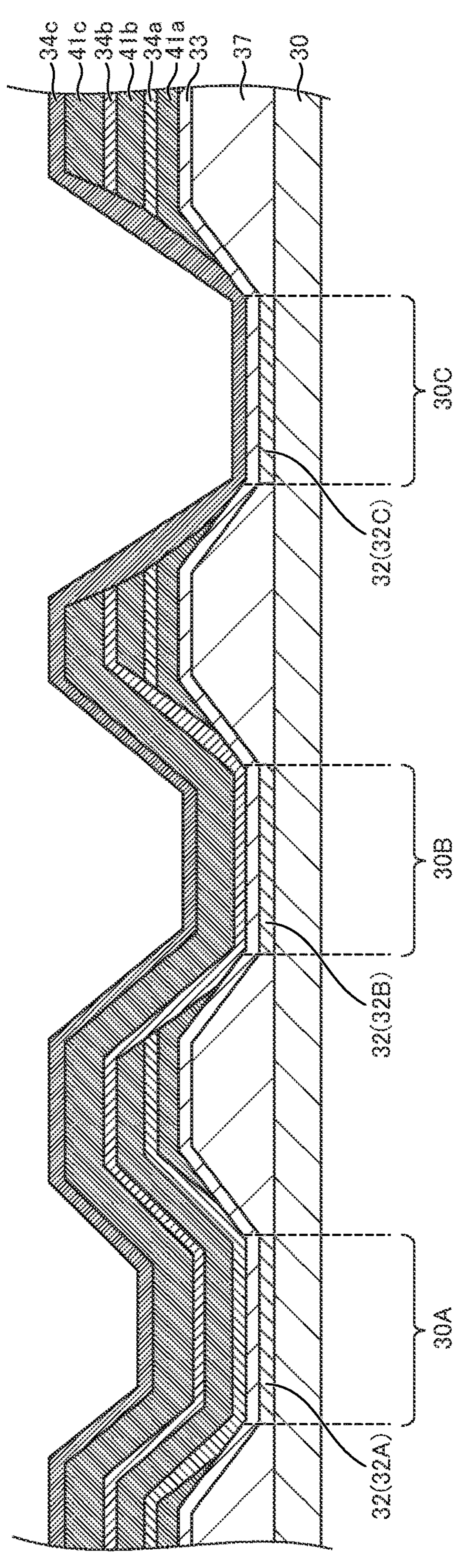
FIG. 11C is a schematic sectional view of the intermediate product of the display device according to the modification of the first embodiment.

As shown in FIG. 10 and FIG. 11C, the next (Step S59, step j)) is forming the third light-emitting material layer 34*c* over the substrate 30 provided with the third resist layer 41*c* having a pattern shape with the portion corresponding to the third region 30C being removed. That is, as illustrated in FIG. 11C, the third light-emitting material layer 34*c* is formed by applying a third light-emitting material containing quantum dots over the exposed first common charge transport layer 33 above the third region 30C of the substrate 30 with the first resist layer 41*a* removed, and over the patterned third resist layer 41*c*.

Figure 11D:
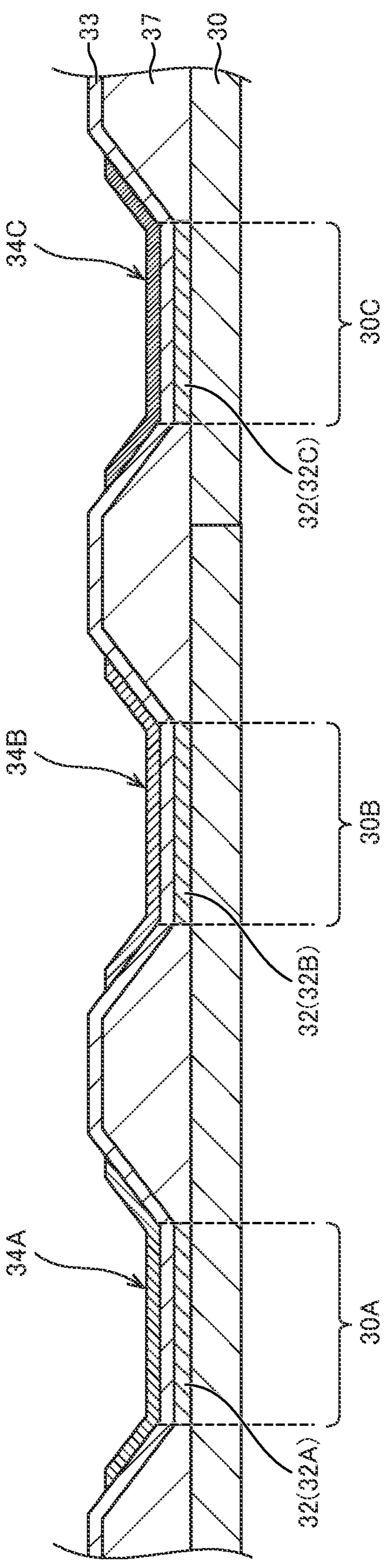
FIG. 11D is a schematic sectional view of the intermediate product of the display device according to the modification of the first embodiment.

As shown in FIG. 10 and FIG. 11D, the following is removing, through exposure and development, the second resist layer 41*b* formed over the first light-emitting material layer 34*a* located in correspondence with the first region 30A. The following is lifting off the second light-emitting material layer 34*b*, third resist layer 41*c*, and third light-emitting material layer 34*c* formed over the second resist layer 41*b* that is removed, to produce the first light-emitting layer 34A that is the first light-emitting material layer 34*a* formed over the first region 30A.

In addition, the third resist layer 41*c* formed over the second light-emitting material layer 34*b* located in correspondence with the second region 30B undergoes removal through exposure and development. The following is lifting off the third light-emitting material layer 34*c* formed over the second resist layer 41*b* that is removed, to produce the second light-emitting layer 34B that is the second light-emitting material layer 34*b* formed over the second region 30B.

In addition, the third light-emitting material layer 34*c* formed over the third region 30C constitutes the third light-emitting layer 34C. The first light-emitting layer 34A, the second light-emitting layer 34B, and the third light-emitting layer 34C are formed in this way (Step S60, step k)).

Still furthermore, as illustrated in FIG. 11D, the first resist layer 41*a* over the bank 37 undergoes removal through exposure and development, followed by lifting off the first light-emitting material layer 34*a*, second resist layer 41*b*, second light-emitting material layer 34*b*, third resist layer 41*c*, and third light-emitting material layer 34*c* formed above the bank 37.

The development in Step S60 may be performed through organic-solvent development. The organic-solvent development does not necessarily require exposure. Further, even in the case of performing exposure, deterioration of the light-emitting layers 34 due to the exposure can be prevented.

Figure 12:
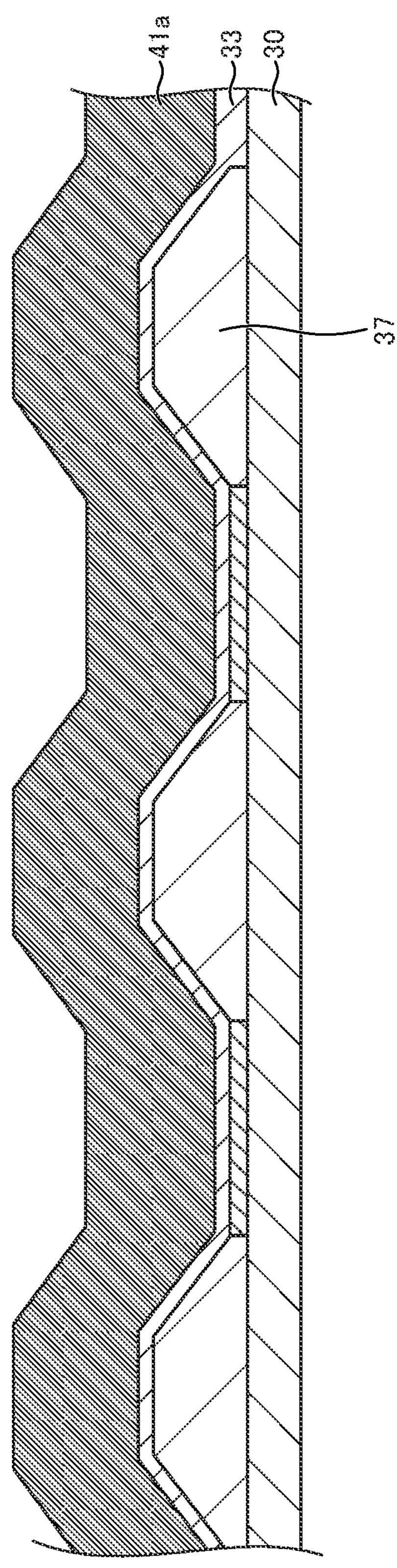
FIG. 12 is a schematic sectional view of the intermediate product of the display device according to a modification of the first embodiment.

Still furthermore, as illustrated in FIG. 12, the first resist layer 41*a* may be formed over the substrate 30 in such a manner that the first resist layer 41*a* is thicker than the bank 37. FIG. 12 is a schematic sectional view of the intermediate product of the display device 1 according to a modification of the first embodiment. For convenience in description, FIG. 12 illustrates only a location including the first region 30A and second region 30B. FIG. 12 schematically illustrates the relationship between the thickness of the bank 37 and the thickness of the first resist layer 41*a*. For instance, a configuration where the bank is 800 nm thick, and where the first resist layer 41*a* has a thickness greater than 800 nm enables the stack including the first resist layer 41*a*, second resist layer 41*b*, and third resist layer 41*c* to be more easily detached from the substrate 30 than a configuration where the first resist layer 41*a* has a thickness smaller than 800 nm.

Figure 11E:
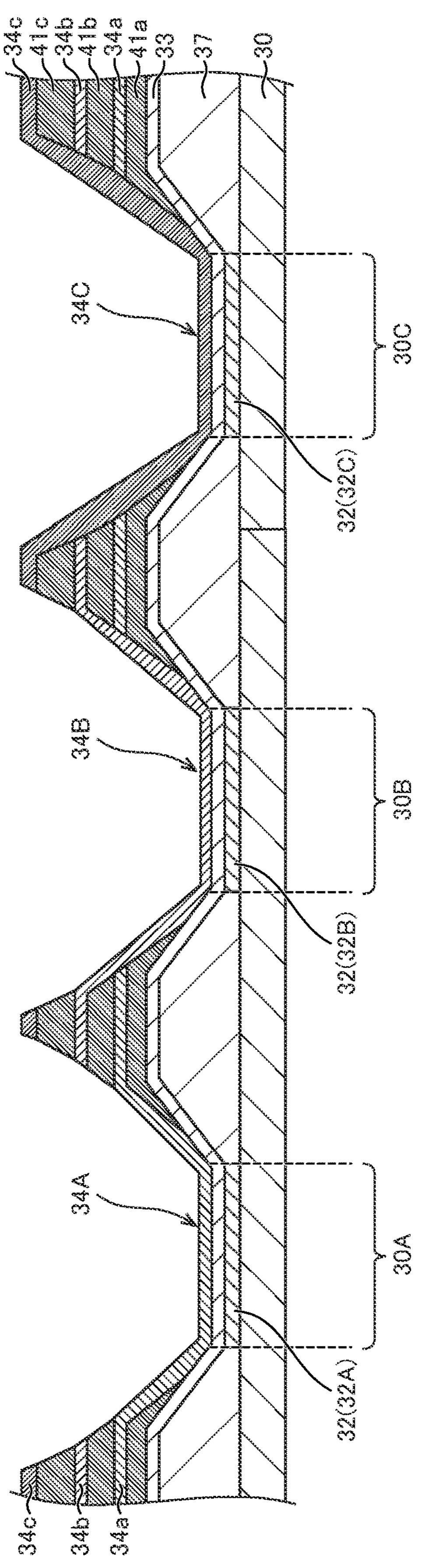
FIG. 11E is a schematic sectional view of the intermediate product of the display device according to the modification of the first embodiment.

It is noted that the stack of the first resist layer 41*a*, first light-emitting material layer 34*a*, second resist layer 41*b*, second light-emitting material layer 34*b*, third resist layer 41*c*, and third light-emitting material layer 34*c* over the bank 37 is removed in the foregoing step of forming the light-emitting layers 34. However, the stack may remain over the bank 37, as illustrated in FIG. 11E.

As described above, the distance between the first common charge transport layer 33 and common electrode 36 can be maintained over the bank 37 when the pixel 11 is configured in such a manner that the stack including the first resist layer 41*a*, second resist layer 41*b*, and third resist layer 41*c* remains over the bank 37. This can avoid a leakage current resulting from approach of the first common charge transport layer 33 and common electrode 36.

Further, the first resist layer 41*a* is disposed between the first light-emitting layer 34A (first light-emitting material layer 34*a*) and the first common charge transport layer 33, the second resist layer 41*b* is disposed between the second light-emitting layer 34B (second light-emitting material layer 34*b*) and the first light-emitting layer 34A, and the third resist layer 41*c* is disposed between the third light-emitting layer 34C (third light-emitting material layer 34*c*) and the second light-emitting layer 34B. This can avoid light emission resulting from leakage of a current flowed through the first common charge transport layer 33 into the first light-emitting layer 34A, second light-emitting layer 34B, or third light-emitting layer 34C over the bank 37.

Through the foregoing process steps, the first light-emitting layer 34A can be formed over the substrate 30 with the first pixel electrode 32A and first common charge transport layer 33 interposed therebetween. In addition, the second light-emitting layer 34B can be formed over the substrate 30 with the second pixel electrode 32B and first common charge transport layer 33 interposed therebetween. In addition, the third light-emitting layer 34C can be formed over the substrate 30 with the third pixel electrode 32C and first common charge transport layer 33 interposed therebetween.

Further, the first light-emitting layer 34A formed over the substrate 30 contains a first quantum dot, the second light-emitting layer 34B formed thereover contains a second quantum dot, and the third light-emitting layer 34C formed thereover contains a third quantum dot. At this time, the ratio of ligands coordinating with the second quantum dot is set to be smaller than the ratio of ligands coordinating with the first quantum dot, and ligands coordinating with the third quantum dot.

That is, during the development, the developing solution permeates toward the lower surface through the colloidal light-emitting layer 34. The presence of ligands within the light-emitting layer 34 hinders the permeation of the developing solution. Accordingly, to promote the permeation of the developing solution, the ratio of ligands contained in the light-emitting layer 34 is preferably small.

By the way, in the step of forming the light-emitting layers 34 according to the modification of the first embodiment, removing the first resist layer 41*a* corresponding to the third region 30C for liftoff in Step S58 offers a stack having the most layers in the liftoff removal. Alternatively, removing the second resist layer 41*b* corresponding to the first region 30A for liftoff in Step S60 offers a stack having the most layers. In these two cases, a light-emitting material layer included in the removed stack is the second light-emitting material layer 34*b*.

Accordingly, setting the ratio of ligands coordinating with the second quantum dot contained in the second light-emitting material layer 34*b*, constituting the second light-emitting layer 34B, to be smaller than the ratio of ligands coordinating with the first quantum dot, and ligands coordinating with the third quantum dot can reduce the hindrance to the permeation of the developing solution in a case where the stack that undergoes liftoff removal has the most layers.

Consequently, the stack's detachability from the substrate 30 can be improved in the step of forming the light-emitting layers 34 according to the modification of the first embodiment even in a case where the stack that undergoes liftoff removal has the most layers.

It is noted that when the first subpixel 21A, second subpixel 21B, and third subpixel 21C included in the pixel 11 are subpixels that emit respective light beams of three different colors (e.g., green, red, and blue), the second light-emitting layer 34B is a light-emitting layer that emits red light, and that has fewer ligands and higher detachability than a light-emitting layer that emits green light, and a light-emitting layer that emits blue light.

It is noted that the first embodiment and the modification of the first embodiment have described the step of forming the light-emitting layers 34 included in the display device 1, wherein the light-emitting layers 34 are formed after the bank 37 is formed.

However, after the first light-emitting layer 34A, the second light-emitting layer 34B, and the third light-emitting layer 34C are formed, the bank 37 may be formed so as to individually section the first light-emitting layer 34A, the second light-emitting layer 34B, and the third light-emitting layer 34C.

Figure 13:
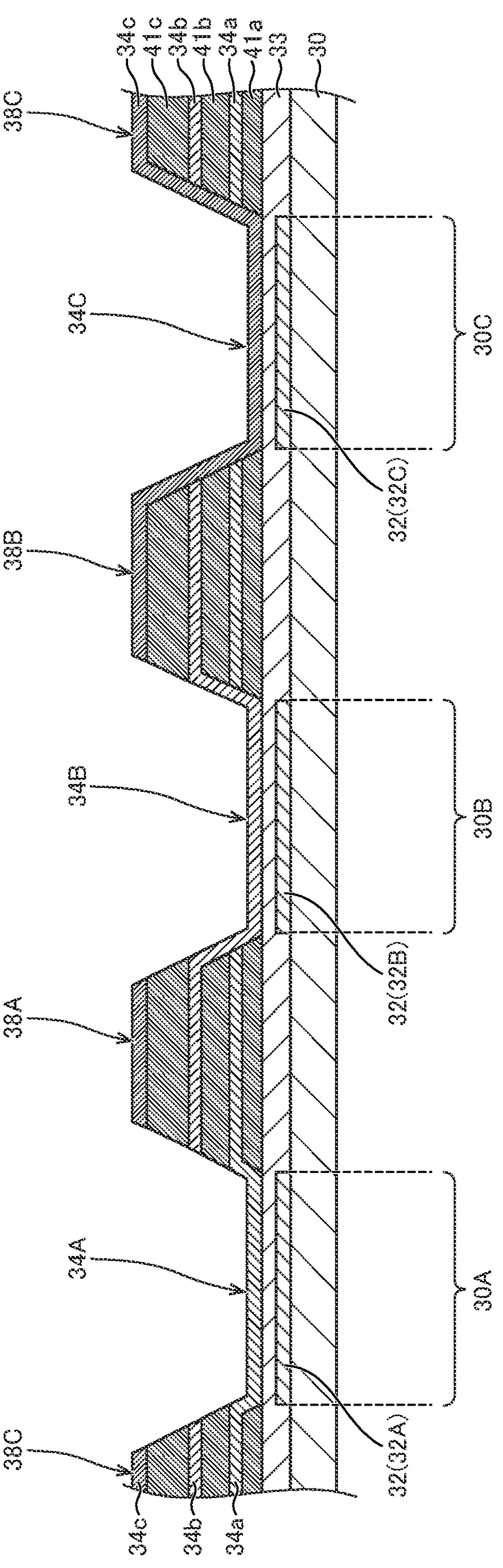
FIG. 13 is a schematic sectional view of the intermediate product of the display device according to a modification of the first embodiment.

For instance, as illustrated in FIG. 13, a configuration may be applied where without the stack (first stack 38A) formed between the first light-emitting layer 34A and the second light-emitting layer 34B being removed, without the stack (second stack 38B) formed between the second light-emitting layer 34B and the third light-emitting layer 34C being removed, and without the stack (third stack 38C) formed between the third light-emitting layer 34C and the first light-emitting layer 34A being removed, the first stack 38A, the second stack 38B, and the third stack 38C are each used as the bank 37. FIG. 13 is a schematic sectional view of the intermediate product of the display device 1 according to a modification of the first embodiment. In such a configuration where the first stack 38A, the second stack 38B, and the third stack 38C are each used as the bank 37, the first resist layer 41*a* may be configured so as to remain over the edge of the pixel electrode 32, and over the contact hole where the connecting conductor that electrically connects the pixel electrode 32 and the thin-film transistor together is provided.

Figure 14:
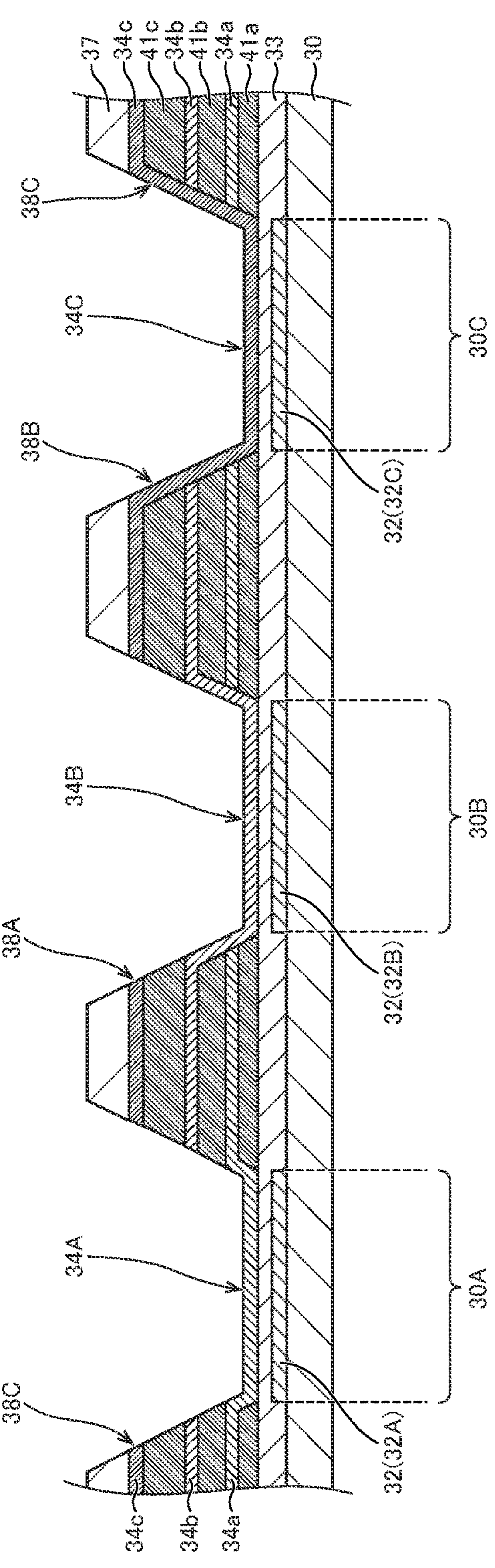
FIG. 14 is a schematic sectional view of the intermediate product of the display device according to a modification of the first embodiment.

Further, for instance, a configuration may be applied where, as illustrated in FIG. 14, the bank 37 is formed so as to individually cover the first stack 38A, the second stack 38B, and the third stack 38C from above. FIG. 14 is a schematic sectional view of the intermediate product of the display device 1 according to a modification of the first embodiment.

Figure 15:
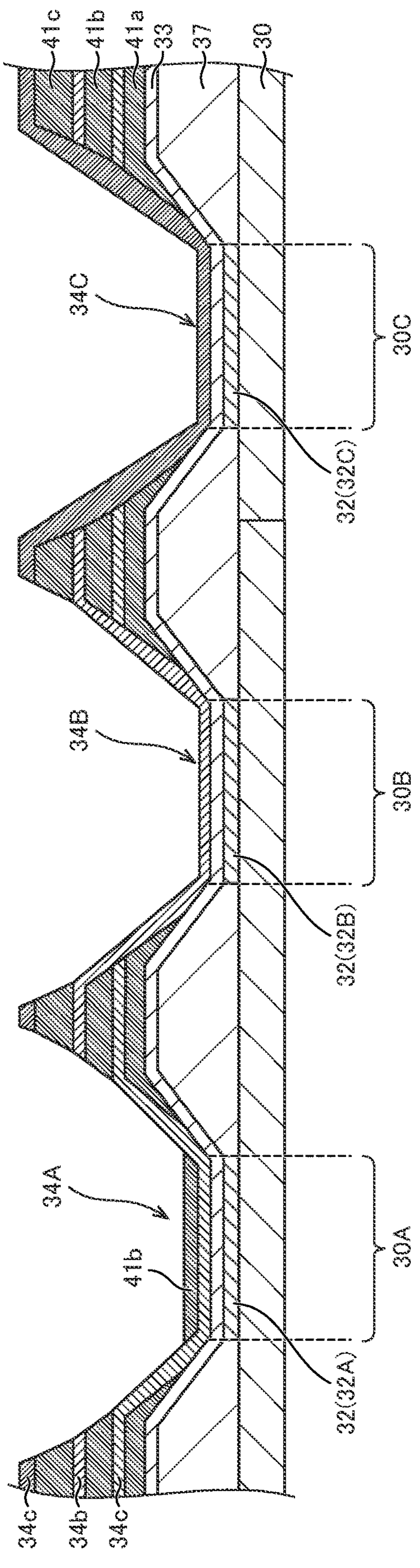
FIG. 15 is a schematic sectional view of the intermediate product of the display device according to a modification of the first embodiment.

Still furthermore, a configuration may be applied where, as illustrated in FIG. 15, part of the resist layer 41 remains on the upper surface of any of the first light-emitting layer 34A, second light-emitting layer 34B, and third light-emitting layer 34C. FIG. 15 is a schematic sectional view of the intermediate product of the display device 1 according to a modification of the first embodiment. FIG. 15 illustrates an instance where part of the second resist layer 41*b* remains over the first light-emitting layer 34A. That is, in removing the resist layer 41 from the light-emitting layer 34 through exposure and development, performing intermediate exposure using a halftone mask or graytone mask enables part of the resist layer 41 to remain over the light-emitting layer 34.

Such a configuration where part of the resist layer 41 remains over the light-emitting layer 34 enables the balance between the amount of hole injection into quantum dots and the amount of electron injection thereinto to be adjusted in the light-emitting layer 34. Further, the amount of exposure of the light-emitting layer 34 is reduced in removing the resist layer over the light-emitting layer 34, and the light-emitting layer 34 thus can be prevented from deterioration.

Comparison with Comparative Example

By the way, the step of forming the light-emitting layers 34 according to the first embodiment, and the step of forming the light-emitting layers 34 according to the modification of the first embodiment include removing the resist layers 41 to form the plurality of light-emitting layers 34 in the final process step.

In contrast to this, there is a method of forming individual light-emitting layers one by one through liftoff (hereinafter, a step of forming light-emitting layers according to a comparative example), like, for instance, the step of forming the light-emitting layers disclosed in Patent Literature 1 or other documents. Accordingly, an advantage of the step of forming the light-emitting layers 34 according to the modification of the first embodiment will be described by way of example in comparison with the step of forming the light-emitting layers according to the comparative example.

Figure 16:
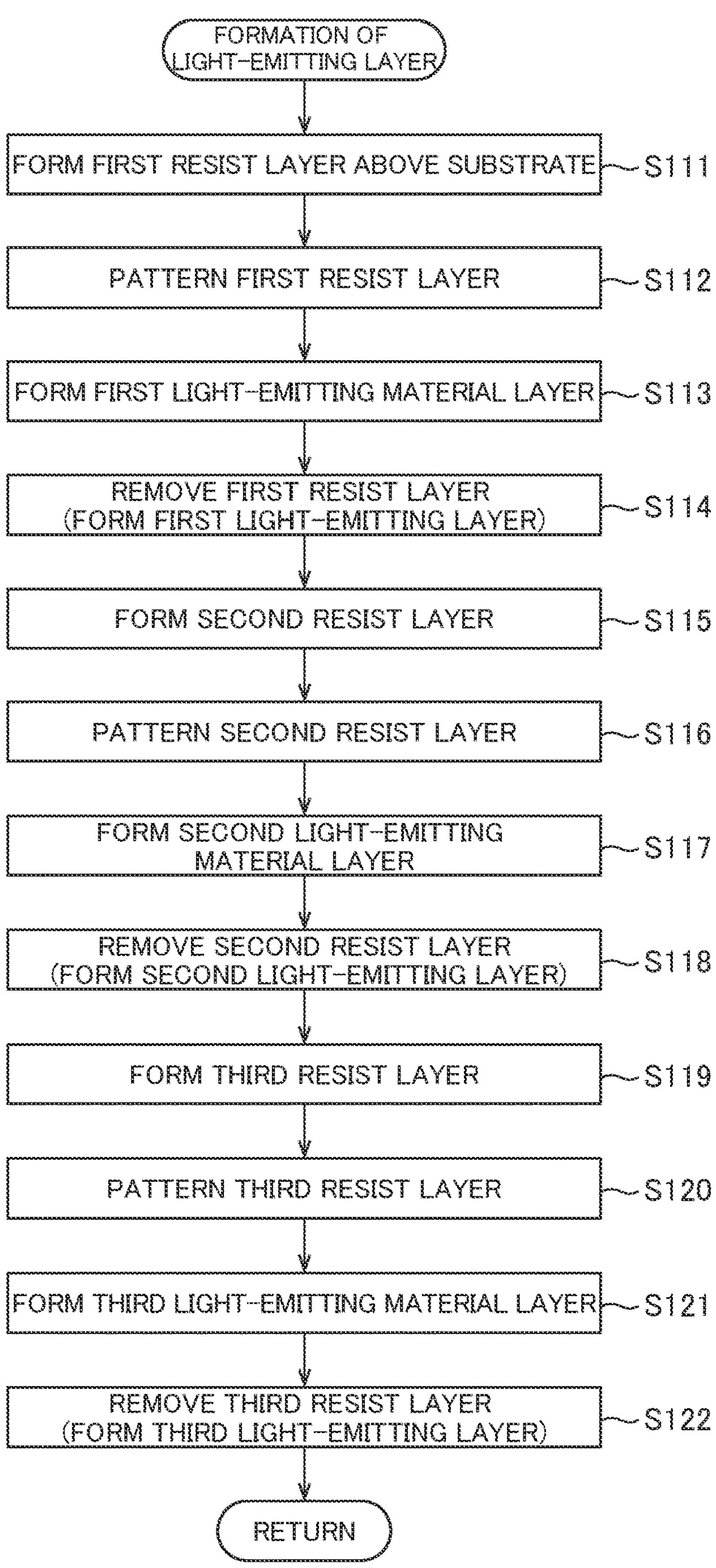
FIG. 16 is a flowchart showing an example step of forming light-emitting layers included in a display device according to a comparative example.

Firstly, the step of forming the light-emitting layers according to the comparative example will be described with reference to FIG. 16 and FIG. 17A to FIG. 17L. FIG. 16 is a flowchart showing an example step of forming light-emitting layers 134 included in a display device according to the comparative example. FIG. 17A to FIG. 17L are schematic sectional views of the intermediate product of the display device according to the comparative example. For easy understanding of manufacturing process steps, FIG. 17A to FIG. 17L omit the bank and the pixel electrodes. Further, each layer is illustrated in the form of a block.

It is noted that in some cases, a first resist layer 141*a*, a second resist layer 141*b*, and a third resist layer 141*c*, all of which are used in the step of forming the light-emitting layers 134 and will be described later on, will be merely referred to as resist layers 141 unless there is a need to distinguish between them in particular.

Figure 17A:
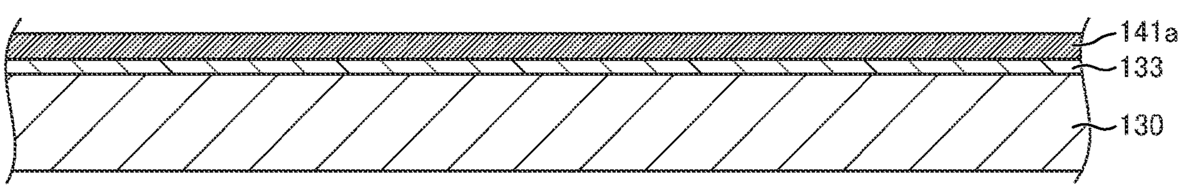
FIG. 17A is a schematic sectional view of the intermediate product of the display device according to the comparative example.
Figure 17B:
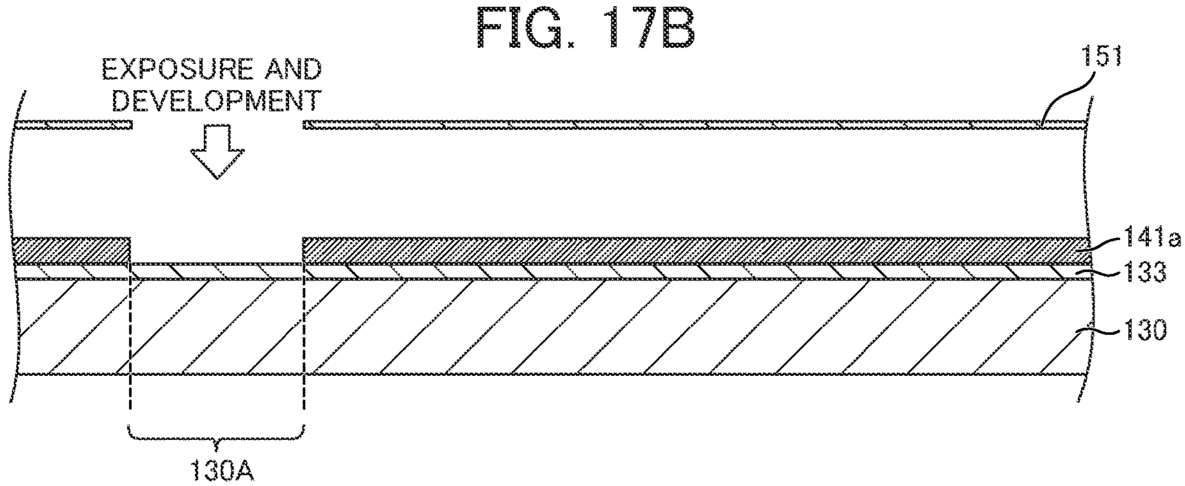
FIG. 17B is a schematic sectional view of the intermediate product of the display device according to the comparative example.
Figure 17C:
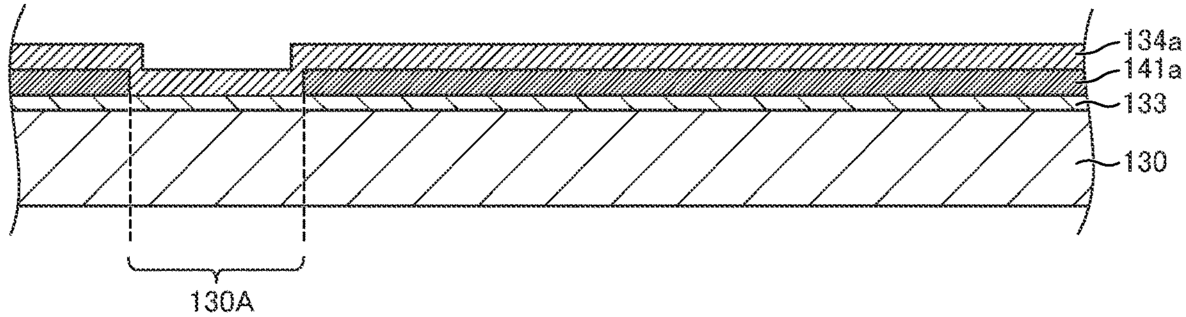
FIG. 17C is a schematic sectional view of the intermediate product of the display device according to the comparative example.

The process steps in Step S111 through Step S113 shown in FIG. 16 and FIG. 17A through FIG. 17C are similar to the process steps in Step S51 through Step S53 shown in FIG. 10. That is, as shown in FIG. 16 and FIG. 17A, the first process step (Step S111) is forming the first resist layer 141*a* above a substrate 130 with a first common charge transport layer 133 stacked thereon. As shown in FIG. 16 and FIG. 17B, the next (Step S112) is patterning the first resist layer 141*a* by removing, through exposure and development, the first resist layer 141*a* corresponding to a first region 130A. As shown in FIG. 16 and FIG. 17C, the following (Step S113) is forming a first light-emitting material layer 134*a* over the patterned first resist layer 141*a*.

After forming the first light-emitting material layer 134*a*, as shown in FIG. 16 and FIG. 17D, the next (Step S114) is removing the first resist layer 141*a* through exposure and development. This forms the first light-emitting layer 134A above the first region 130A of the substrate 130, that is, over the first common charge transport layer 133 corresponding to the first region 130A.

As shown in FIG. 16 and FIG. 17E, the next (Step S115) is forming the second resist layer 141*b* over the first common charge transport layer 133 with the first light-emitting layer 134A formed. As shown in FIG. 16 and FIG. 17F, the next (Step S116) is patterning the second resist layer 141*b* by removing, through exposure and development, the second resist layer 141*b* corresponding to a second region 130B.

Figure 17G:
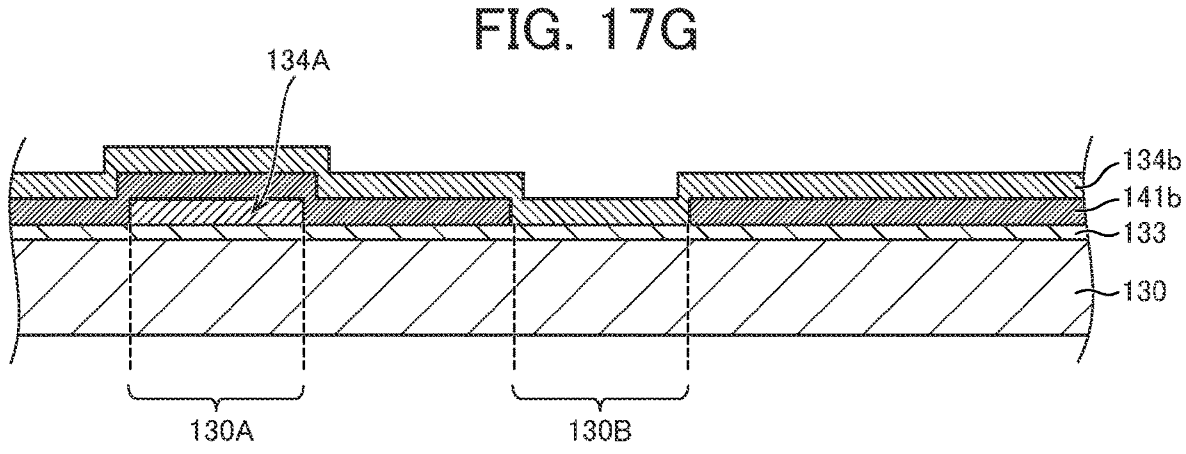
FIG. 17G is a schematic sectional view of the intermediate product of the display device according to the comparative example.

As shown in FIG. 16 and FIG. 17G, the next (Step S117) is forming a second light-emitting material layer 134*b*. That is, the second light-emitting material layer 134*b* is formed over the second region 130B of the substrate 130, and over the patterned second resist layer 141*b*.

Figure 17H:
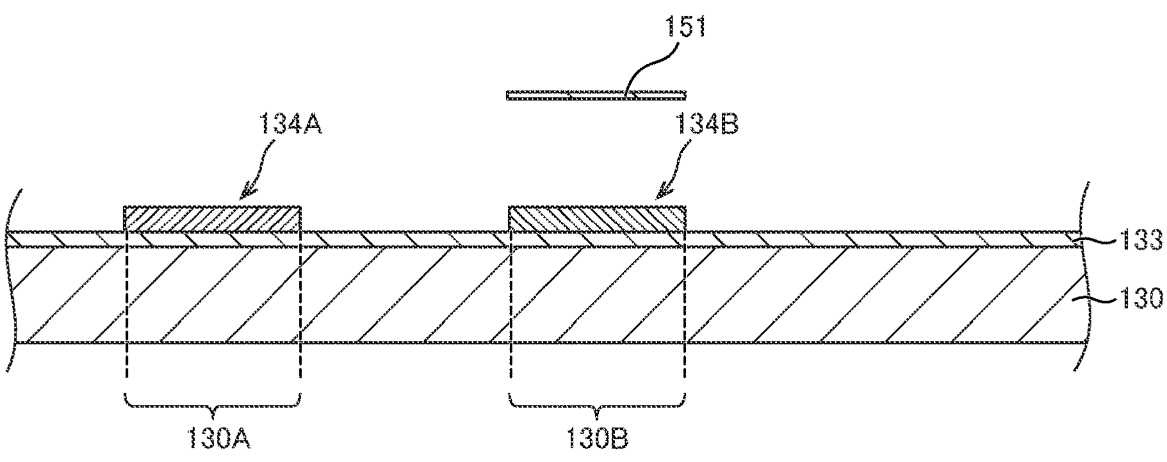
FIG. 17H is a schematic sectional view of the intermediate product of the display device according to the comparative example.

As shown in FIG. 16 and FIG. 17H, the next (Step S118) is removing the second resist layer 141*b* through exposure and development. This forms the second light-emitting layer 134B above the second region 130B of the substrate 130, that is, over the first common charge transport layer 133 corresponding to the second region 130B.

Figure 17I:
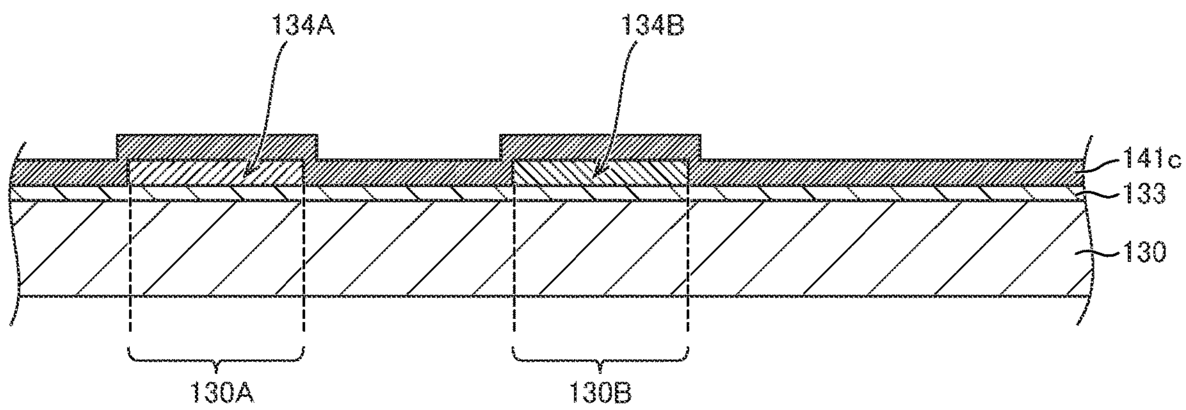
FIG. 17I is a schematic sectional view of the intermediate product of the display device according to the comparative example.
Figure 17J:
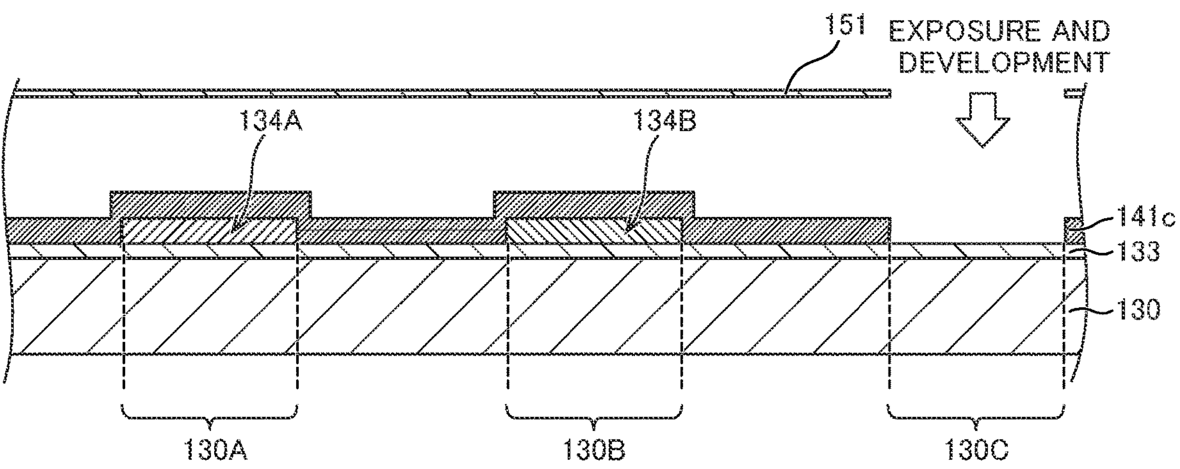
FIG. 17J is a schematic sectional view of the intermediate product of the display device according to the comparative example.

As shown in FIG. 16 and FIG. 17I, the next (Step S119) is forming the third resist layer 141*c* over the first common charge transport layer 133 with the first light-emitting layer 134A and second light-emitting layer 134B formed. As shown in FIG. 16 and FIG. 17J, the next (Step S120) is patterning the third resist layer 141*c* by removing, through exposure and development, the third resist layer 141*c* corresponding to a third region 130C.

Figure 17K:
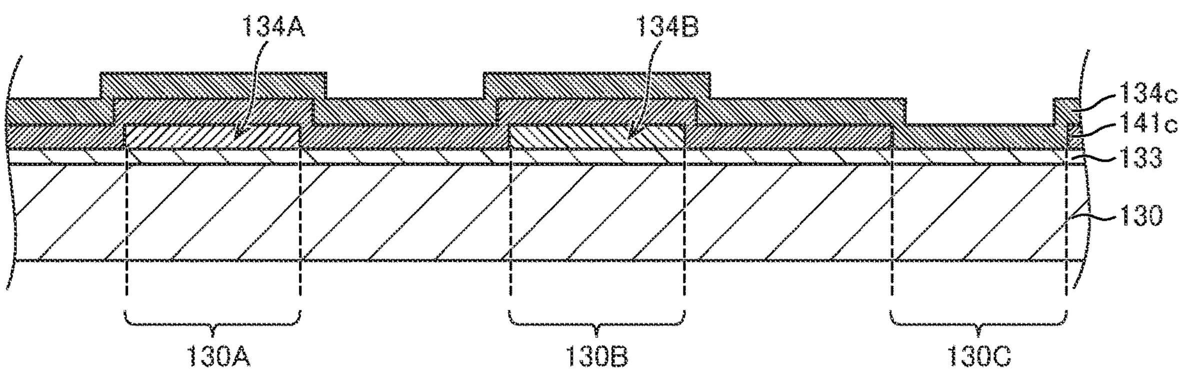
FIG. 17K is a schematic sectional view of the intermediate product of the display device according to the comparative example.

As shown in FIG. 16 and FIG. 17K, the next (Step S121) is forming a third light-emitting material layer 134*c*. That is, the third light-emitting material layer 134*c* is formed above the third region 130C of the substrate 130, and over the patterned third resist layer 141*c*.

Figure 17L:
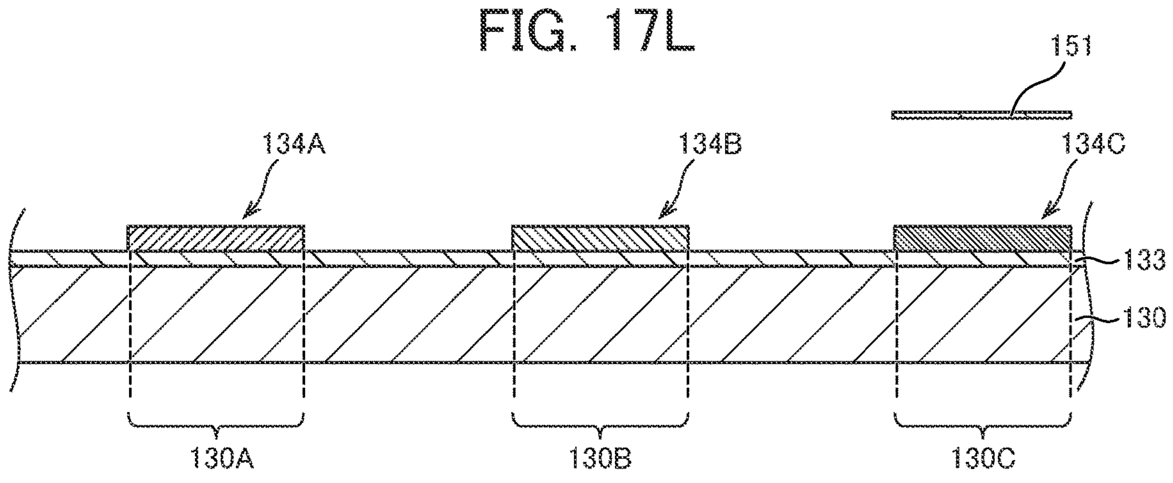
FIG. 17L is a schematic sectional view of the intermediate product of the display device according to the comparative example.

As shown in FIG. 16 and FIG. 17L, the next (Step S122) is removing the third resist layer 141*c* through exposure and development. This forms the third light-emitting layer 134C above the third region 130C of the substrate 130, that is, over the first common charge transport layer 133 corresponding to the third region 130C.

As described above, to form three kinds of light-emitting layers over the substrate, the step of forming the light-emitting layers 143 according to the comparative example involves 12 process steps in total. In contrast to this, the step of forming the light-emitting layers 34 according to the modification of the first embodiment of the present disclosure involves 10 process steps in total, thus reducing the number of manufacturing process steps when compared with the step of forming the light-emitting layers 143 according to the comparative example.

Further, the light-emitting materials are possibly exposed to the developing solution and are possibly affected by the exposure to light five times in the step of forming the light-emitting layers 143 according to the comparative example: Steps S114, S116, S118, S120, and S122. In contrast to this, there are three times in the step of forming the light-emitting layers 34 according to the modification of the first embodiment: Steps S55, S58, and S60.

Thus, in forming three kinds of light-emitting layers over the substrate, using the step of forming the light-emitting layers according to the modification of the first embodiment can reduce the number of manufacturing process steps further than using the step of forming the light-emitting layers according to the comparative example. Furthermore, the number of times at which the light-emitting materials are possibly exposed to the developing solution, and the number of times at which the light-emitting materials are possibly affected by the exposure to light can be reduced.

It is noted that in forming two kinds of light-emitting layers over the substrate 30, using the step of forming the light-emitting layers 34 according to the modification of the first embodiment can reduce the number of manufacturing process steps when compared with using the step of forming the light-emitting layers according to the comparative example. Furthermore, the number of times at which the light-emitting materials are possibly exposed to the developing solution, and the number of times at which the light-emitting materials are possibly affected by the exposure to light can be reduced.

Further, in the step of forming the light-emitting layers 34 according to the modification of the first embodiment, the first light-emitting material layer 34*a* corresponding to the first region 30A is covered with the resist layer 41 at the time of performing the exposure and development in Step S55. Further, the first light-emitting material layer 34*a* corresponding to the first region 30A, and the second light-emitting material layer 34*b* corresponding to the second region 30B are covered with the resist layer 41 at the time of performing the exposure and development in Step S58.

In contrast to this, in the step of forming the light-emitting layers 134 according to the comparative example, the first light-emitting layer 134A and the second light-emitting layer 134B are not covered with the resist layers 141 at the time of performing the exposure and development in Step S114 and Step S118.

As such, when compared with the step of forming the light-emitting layers 134 according to the comparative example, the step of forming the light-emitting layers 34 according to the modification of the first embodiment can reduce the possibility of deterioration of the first light-emitting layer 34A and second light-emitting layer 34B resulting from exposure to atmosphere.

In addition, since the possibility of deterioration of the first light-emitting layer 34A and second light-emitting layer 34B resulting from exposure to atmosphere can be reduced, quantum dots constituting the light-emitting layers 34 can contain a material that is susceptible to deterioration resulting from exposure to atmosphere, for instance, indium phosphide. That is, at least one of the first quantum dot, second quantum dot, and third quantum dot can contain indium phosphide. This enables cadmium, which is typically contained in a quantum dot and is highly toxic, to be replaced with indium phosphide.

Second Embodiment

Figure 18:
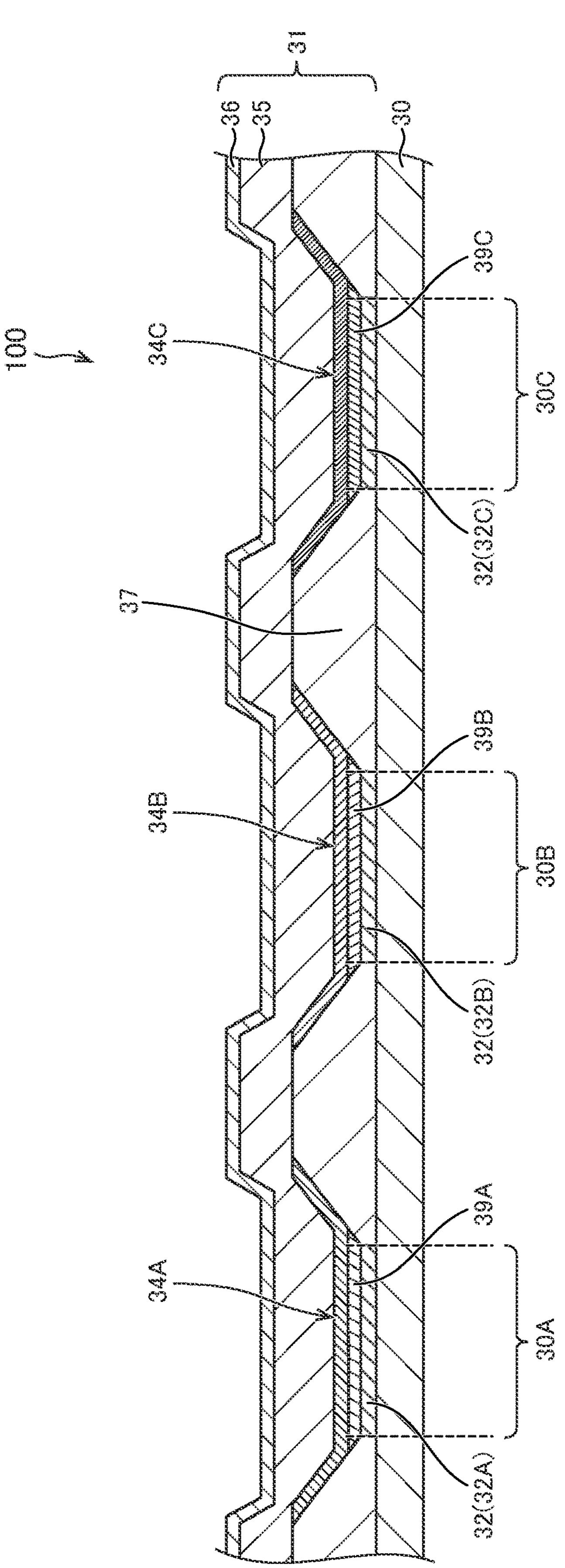
FIG. 18 is a sectional view of a pixel included in a display device according to a second embodiment.

A display device 100 according to a second embodiment will be described with reference to FIG. 18. FIG. 18 is a sectional view of the pixel 11 included in the display device 100 according to the second embodiment. FIG. 18 is a sectional view of the pixel 11 taken along a line similar to line IX-IX in FIG. 8. The display device 100 according to the second embodiment is configured in such a manner that the pixel 11 includes three subpixels 21, like the display device 1 according to the modification of the first embodiment. However, the display device 100 according to the second embodiment is different in configuration from the display device 1 according to the modification of the first embodiment in the following regard.

That is, the display device 100 according to the second embodiment is different from the display device 1 according to the modification of the first embodiment in that the display device 100 includes, instead of the first common charge transport layer 33 provided over the first pixel electrode 32A, second pixel electrode 32B, and third pixel electrode 32C, individualized charge transport layers 39 (a first individualized charge transport layer 39A, a second individualized charge transport layer 39B, and a third individualized charge transport layer 39C) provided individually in the respective pixel electrodes 32. Other than the foregoing, the display device 100 according to the second embodiment has a configuration similar to that of the display device 1 according to the modification of the first embodiment; thus, the same components will be denoted by the same signs, and their description will be omitted.

That is, as illustrated in FIG. 18, the first individualized charge transport layer 39A is provided on the upper surface of the first pixel electrode 32A on the substrate 30 corresponding to the first region 30A. In addition, the second individualized charge transport layer 39B is provided on the upper surface of the second pixel electrode 32B on the substrate 30 corresponding to the second region 30B. In addition, the third individualized charge transport layer 39C is provided on the upper surface of the third pixel electrode 32C on the substrate 30 corresponding to the third region 30C. It is noted that in some cases, the first individualized charge transport layer 39A, the second individualized charge transport layer 39B, and the third individualized charge transport layer 39C will be merely referred to as individualized charge transport layers 39 unless there is a need to distinguish between them in particular.

Such a configuration where the individualized charge transport layer 39 is provided for each pixel electrode 32 enables the individualized charge transport layer 39 to be provided for each light-emitting layer 34. That is, the light-emitting layers 34 have their band gaps that are different in accordance with the color of emitted light. Thus, providing the individualized charge transport layer 39 for each light-emitting layer 34 in accordance with the band gap of the light-emitting layer 34 can improve light emission efficiency.

Method for Forming Light-Emitting Element Layer

Figure 19:
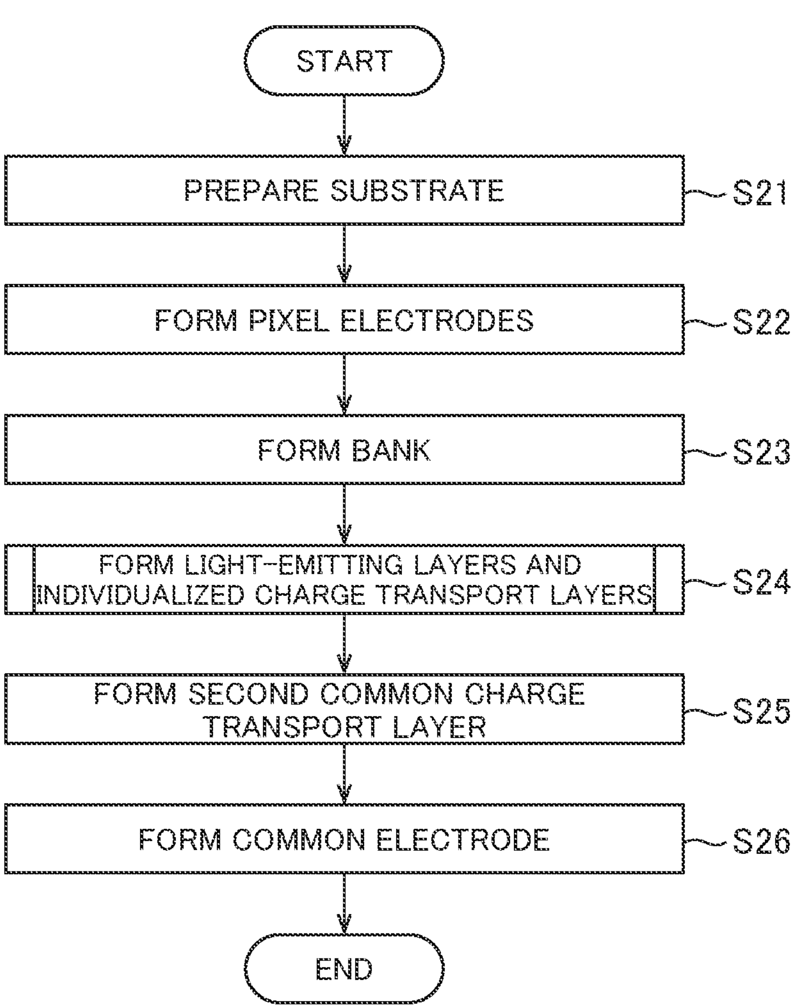
FIG. 19 is a flowchart showing a method for forming a light-emitting element layer included in the display device according to the second embodiment.

A method for forming the light-emitting element layer 31 of the display device 100 according to the second embodiment will be described with reference to FIG. 19. FIG. 19 is a flowchart showing a method for forming the light-emitting element layer 31 included in the display device 100 according to the second embodiment.

As shown in FIG. 19, the first process step (Step S21) is preparing the substrate 30. The next (Step S22) is forming the pixel electrodes 32 over the substrate 30. The formation of the pixel electrodes 32 is followed by a process step (Step S23) of forming the bank 37 so as to surround the pixel electrodes 32. The formation of the bank 37 is followed by a process step (Step S24) of forming the light-emitting layers 34 and the individualized charge transport layers 39, followed by a process step (Step S25) of forming the second common charge transport layer 35 over the light-emitting layers 34 and the bank 37. Then, the formation of the second common charge transport layer 35 is followed by a process step (Step S26) of forming the common electrode 36 over the second common charge transport layer 35.

It is noted that Steps S21 through S23 and Steps S25 through S26 of the method for forming the light-emitting element layer 31 shown in FIG. 19 are similar to Steps S11 through S13 and Steps S16 through S17 of the method for forming the light-emitting element layer 31 shown in FIG. 4, and thus, their description will be omitted.

That is, the display device 100 according to the second embodiment is different from the display device 1 according to the first embodiment, and from the display device 1 according to the modification of the first embodiment in the following regard: in the former device, the individualized charge transport layers 39 are formed when the light-emitting layers 34 are formed in Step S24, whereas in the latter devices, the first common charge transport layer 33 and the light-emitting layers 34 are formed in separate process steps.

The other process steps of the method for forming the light-emitting element layer 31 of the display device 100 according to the second embodiment are similar to those of the methods for forming the light-emitting element layer 31 of the display device 1 according to the first embodiment, and of the display device 1 according to the modification of the first embodiment, and thus, their description will be omitted. The following describes the step of forming the light-emitting layers 34 and the individualized charge transport layers 39, with reference to FIG. 20 and FIG. 21A to FIG. 21M.

Figure 20:
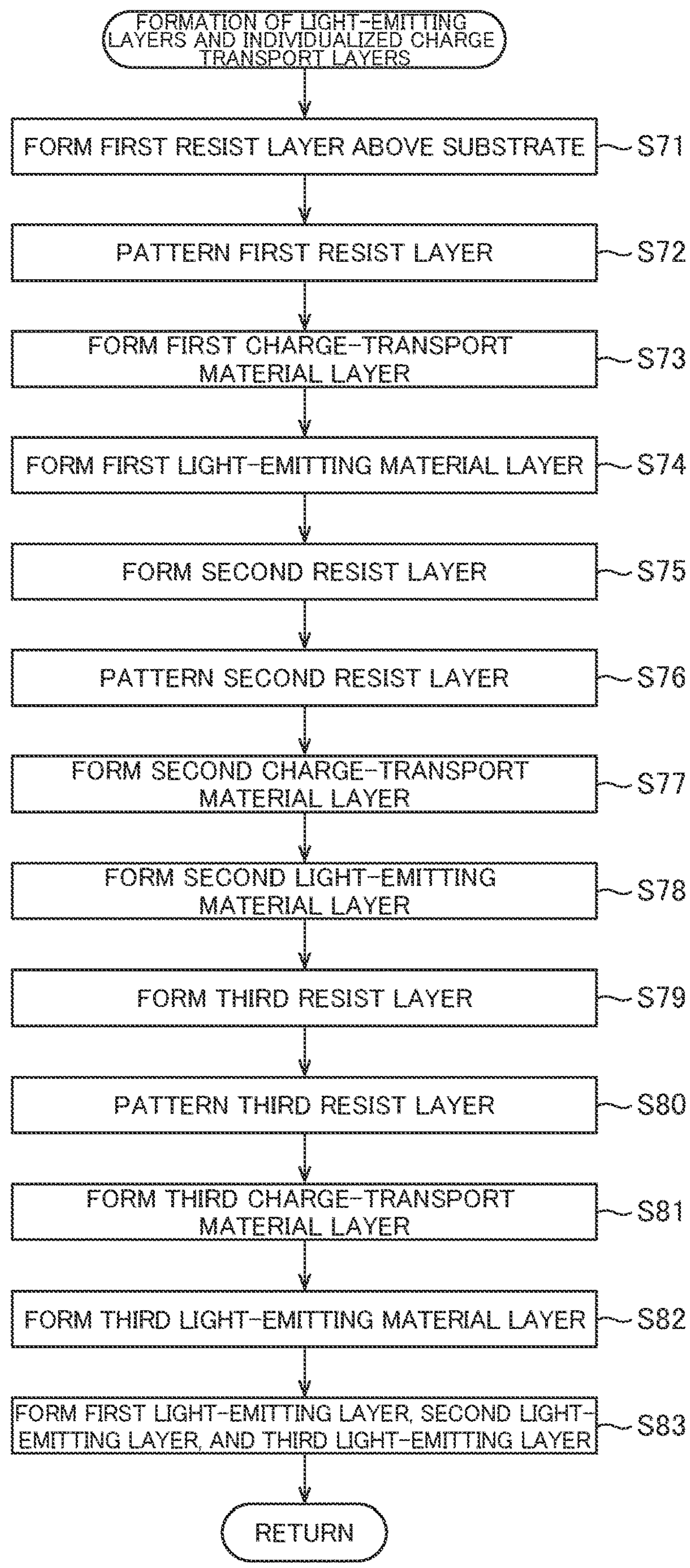
FIG. 20 is a flowchart showing an example step of forming light-emitting layers and individualized charge transport layers included in the display device according to the second embodiment.

Step of Forming Light-Emitting Layers and Individualized Charge Transport Layers FIG. 20 is a flowchart showing an example step of forming the light-emitting layers 34 and individualized charge transport layers 39 included in the display device 100 according to the second embodiment. FIG. 21A to FIG. 21M are schematic sectional views of the intermediate product of the display device 100 according to the second embodiment.

Figure 21A:
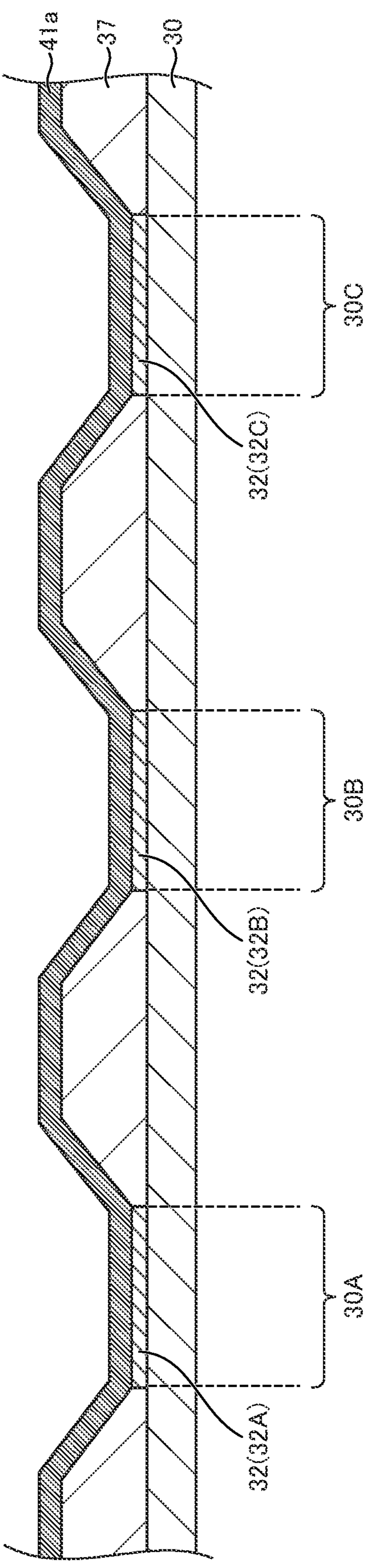
FIG. 21A is a schematic sectional view of the intermediate product of the display device according to the second embodiment.

As shown in FIG. 20 and FIG. 21A, the first process step (Step S71, step l)) is forming the first resist layer 41*a* by applying an insulating positive photoresist above the substrate 30, that is, over the first pixel electrode 32A, second pixel electrode 32B, third pixel electrode 32C, and bank 37 provided over the substrate 30.

Figure 21B:
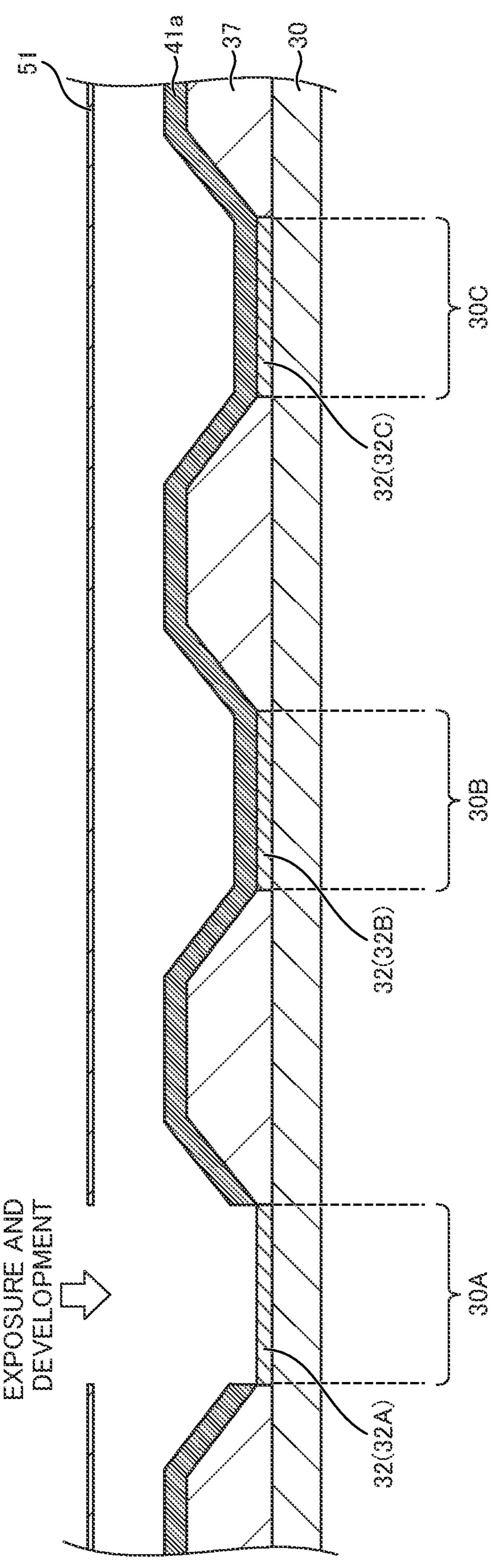
FIG. 21B is a schematic sectional view of the intermediate product of the display device according to the second embodiment.

As shown in FIG. 20 and FIG. 21B, the next (Step S72, step m)) is patterning the first resist layer 41*a* by removing, through exposure and development, the first resist layer 41_a_ formed over the first region 30A of the substrate 30. That is, the first resist layer 41_a_ undergoes exposure via the photomask 51 in such a manner that the first resist layer 41_a_ corresponding to the first region 30A is removed. This process step is followed by development with a developing solution, and rinse. Through the foregoing process steps, the first resist layer 41_a_ having a pattern shape with the portion corresponding to the first region 30A being removed is formed. It is noted that the development can be performed through, for instance, spray development, spin development, or ultrasonic development.

Figure 21C:
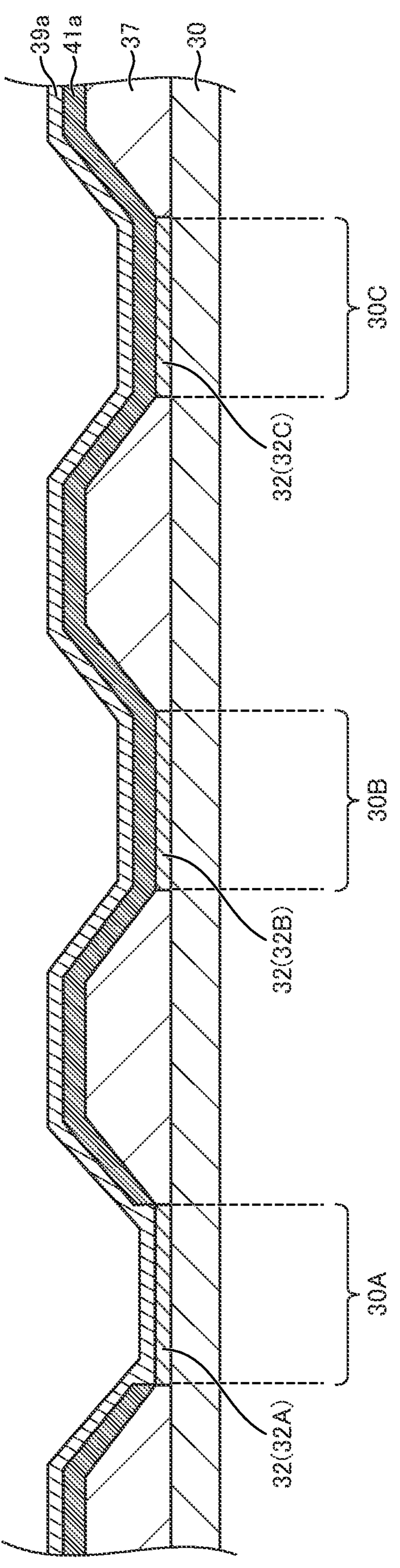
FIG. 21C is a schematic sectional view of the intermediate product of the display device according to the second embodiment.

As shown in FIG. 20 and FIG. 21C, the next (Step S73, step n)) is forming a first charge-transport material layer 39_a_ over the substrate 30 with the first resist layer 41_a_ of the foregoing pattern shape formed. That is, the first charge-transport material layer 39_a_ is formed over the exposed first pixel electrode 32A above the first region 30A of the substrate 30 with the first resist layer 41_a_ removed, and over the patterned first resist layer 41_a_.

Figure 21D:
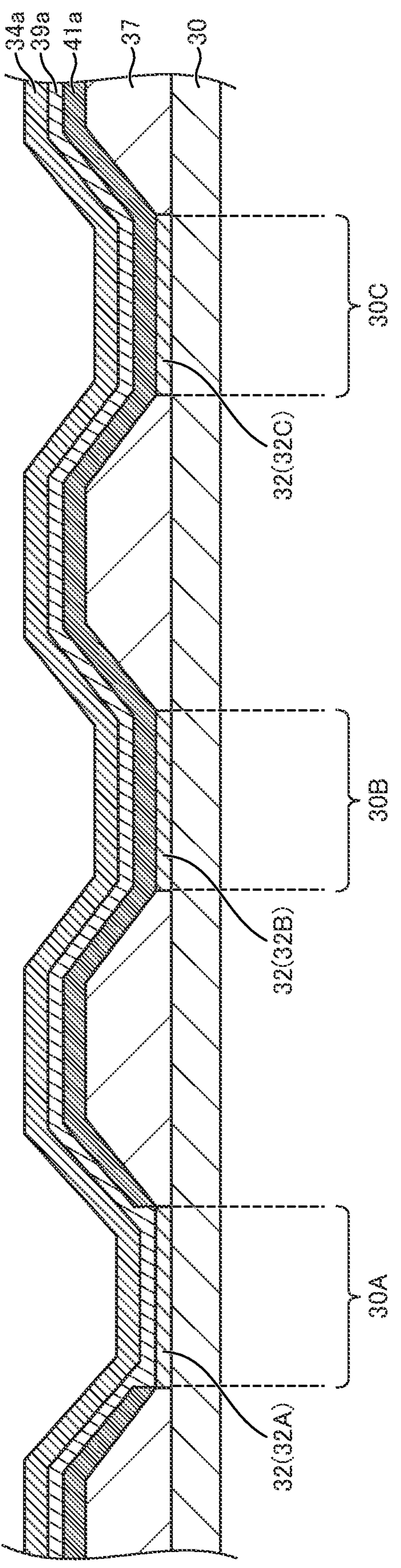
FIG. 21D is a schematic sectional view of the intermediate product of the display device according to the second embodiment.

As shown in FIG. 20 and FIG. 21D, the next (Step S74, step o)) is forming the first light-emitting material layer 34_a_ over the first charge-transport material layer 39_a_ formed in Step S73. That is, the first light-emitting material layer 34_a_ is formed by applying a light-emitting material over a location including portions corresponding to the respective first region 30A, second region 30B, third region 30C, and bank 37 on the first charge-transport material layer 39_a_.

Figure 21E:
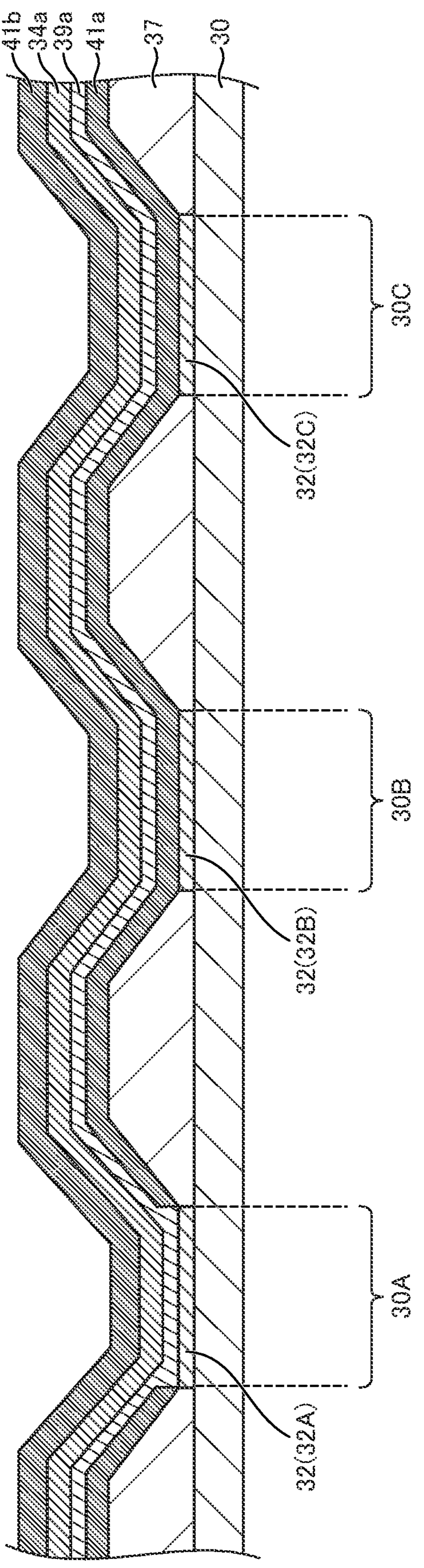
FIG. 21E is a schematic sectional view of the intermediate product of the display device according to the second embodiment.

Furthermore, as shown in FIG. 20 and FIG. 21E, the next (Step S75, step p)) is forming the second resist layer 41_b_ over the first light-emitting material layer 34_a_ formed in the Step S74. That is, the second resist layer 41_b_ is formed by applying an insulating positive photoresist over a location including portions corresponding to the respective first region 30A, second region 30B, third region 30C, and bank 37 on the first light-emitting material layer 34_a_.

Figure 21F:
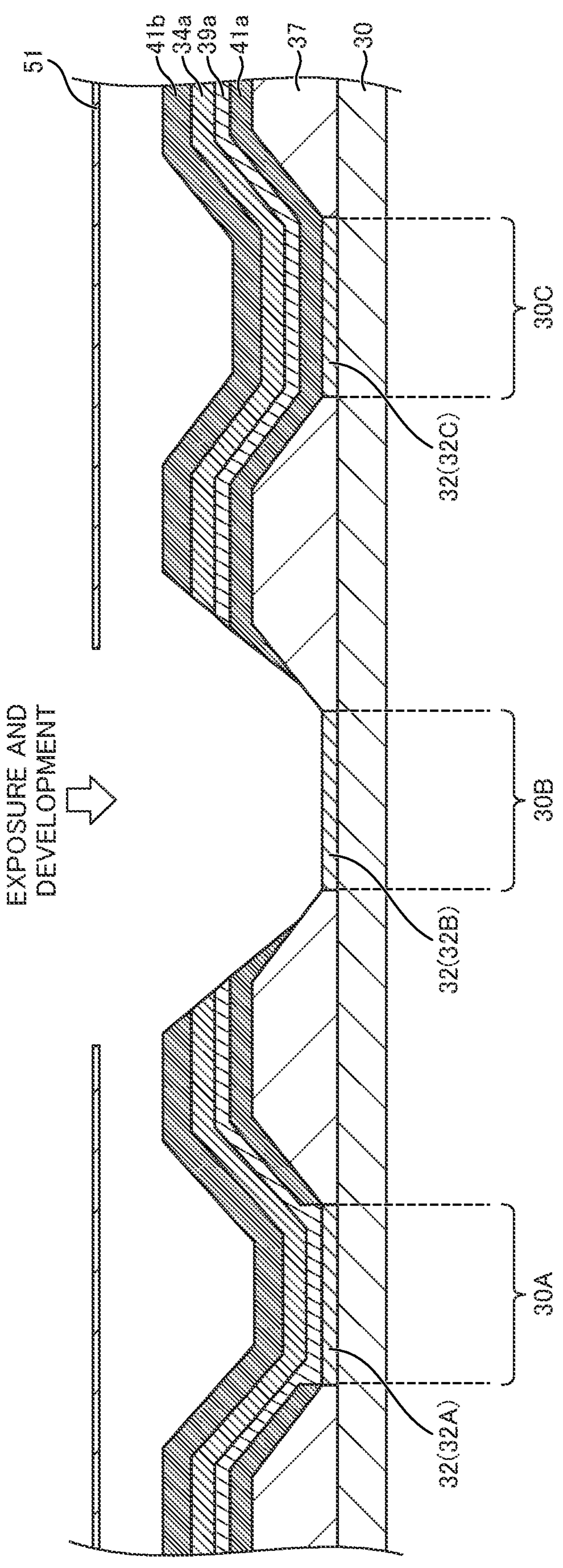
FIG. 21F is a schematic sectional view of the intermediate product of the display device according to the second embodiment.

Then, as shown in FIG. 20 and FIG. 21F, the first resist layer 41_a_ formed over the second region 30B of the substrate 30 undergoes removal through exposure and development. The following (Step S76, step q)) is patterning the second resist layer 41_b_ by lifting off the first charge-transport material layer 39_a_, first light-emitting material layer 34_a_, and second resist layer 41_b_ formed over the first resist layer 41_a_ that is removed.

That is, the first resist layer 41_a_ undergoes exposure via the photomask 51 in such a manner that the first resist layer 41_a_ corresponding to the second region 30B is removed. This process step is followed by development with a developing solution, and rinse. The first resist layer 41_a_ corresponding to the second region 30B is removed in this way. Then, the first charge-transport material layer 39_a_, first light-emitting material layer 34_a_, and second resist layer 41_b_ stacked over the first resist layer 41_a_ that is removed undergo liftoff. Through the foregoing process steps, the second resist layer 41_b_ having a pattern shape with the portion corresponding to the second region 30B being removed is formed.

Step S76 is followed by a process step (Step S77, step r)) of forming a second charge-transport material layer 39_b_ over the substrate 30 provided with the second resist layer 41_b_ having a pattern shape with the portion corresponding to the second region 30B being removed.

Figure 21G:
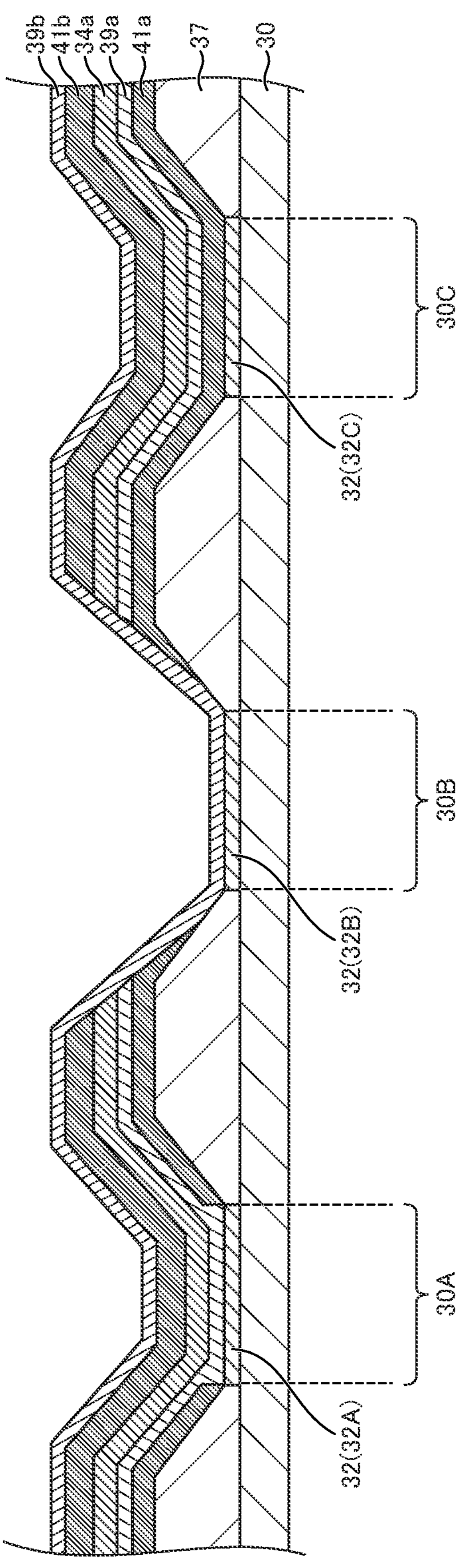
FIG. 21G is a schematic sectional view of the intermediate product of the display device according to the second embodiment.

That is, as illustrated in FIG. 21G, the second charge-transport material layer 39_b_ is formed over the exposed second pixel electrode 32B above the second region 30B of the substrate 30 with the first resist layer 41_a_ removed, and over the patterned second resist layer 41_b_.

Figure 21H:
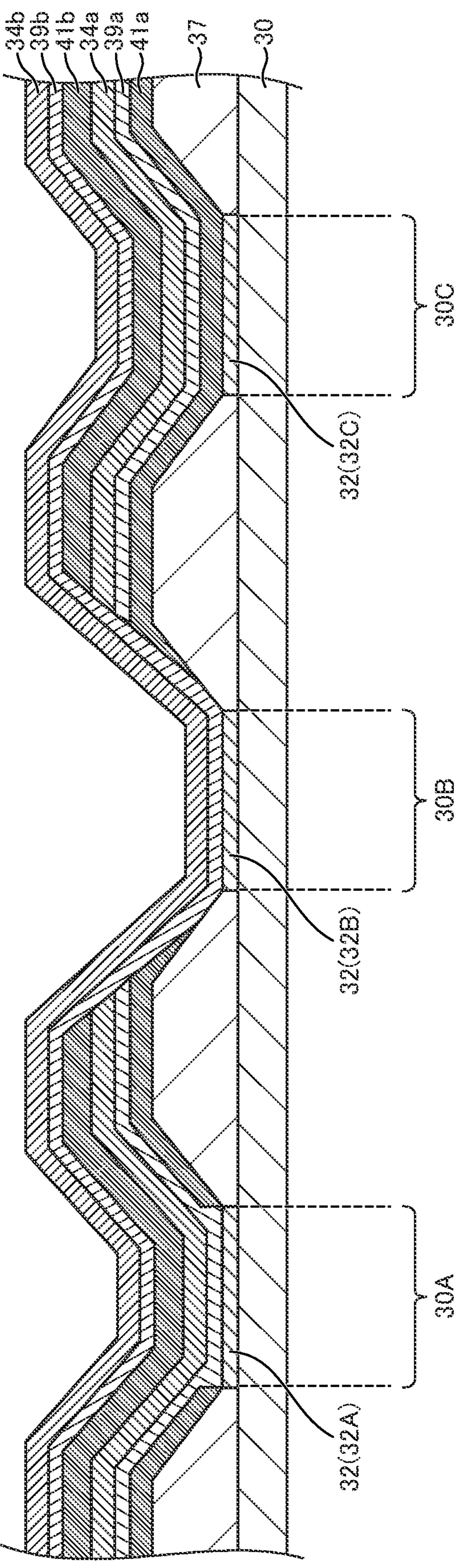
FIG. 21H is a schematic sectional view of the intermediate product of the display device according to the second embodiment.

As shown in FIG. 20 and FIG. 21H, the next (Step S78, step s)) is forming the second light-emitting material layer 34_b_ by applying a second light-emitting material containing quantum dots over the second charge-transport material layer 39_b_.

Figure 21I:
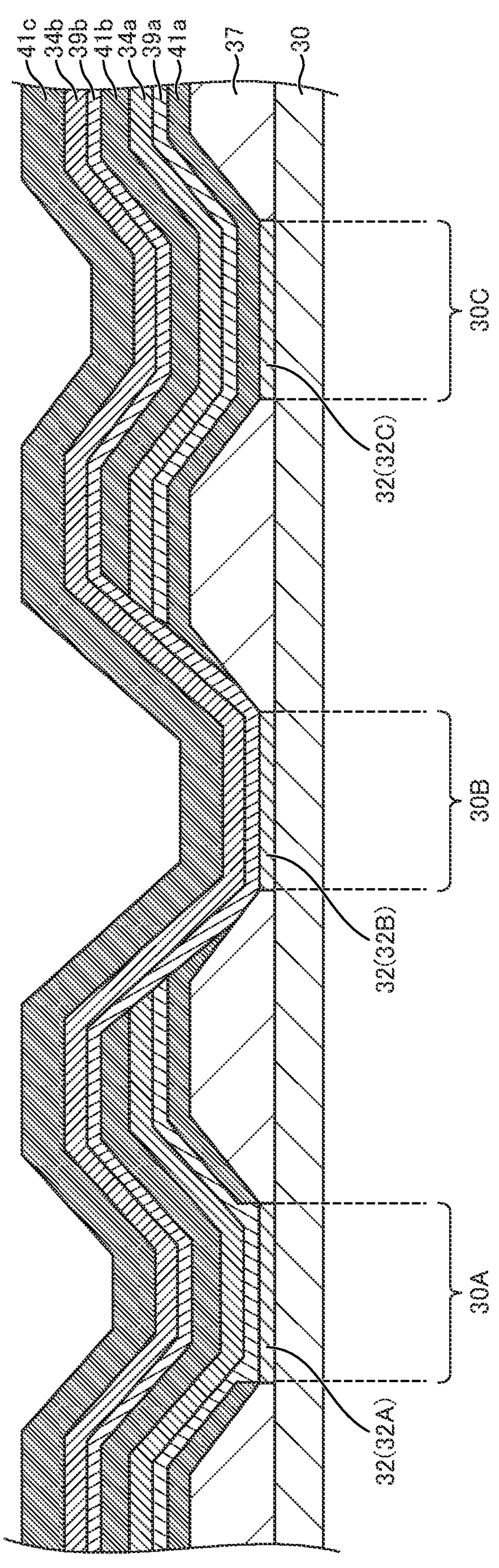
FIG. 21I is a schematic sectional view of the intermediate product of the display device according to the second embodiment.

As shown in FIG. 20 and FIG. 21I, the next (Step S79, step u)) is forming the third resist layer 41_c_ over the second light-emitting material layer 34_b_. That is, the third resist layer 41_c_ is formed by applying an insulating positive photoresist over a location including portions corresponding to the respective first region 30A, second region 30B, third region 30C, and bank 37 on the second light-emitting material layer 34_b_.

Figure 21J:
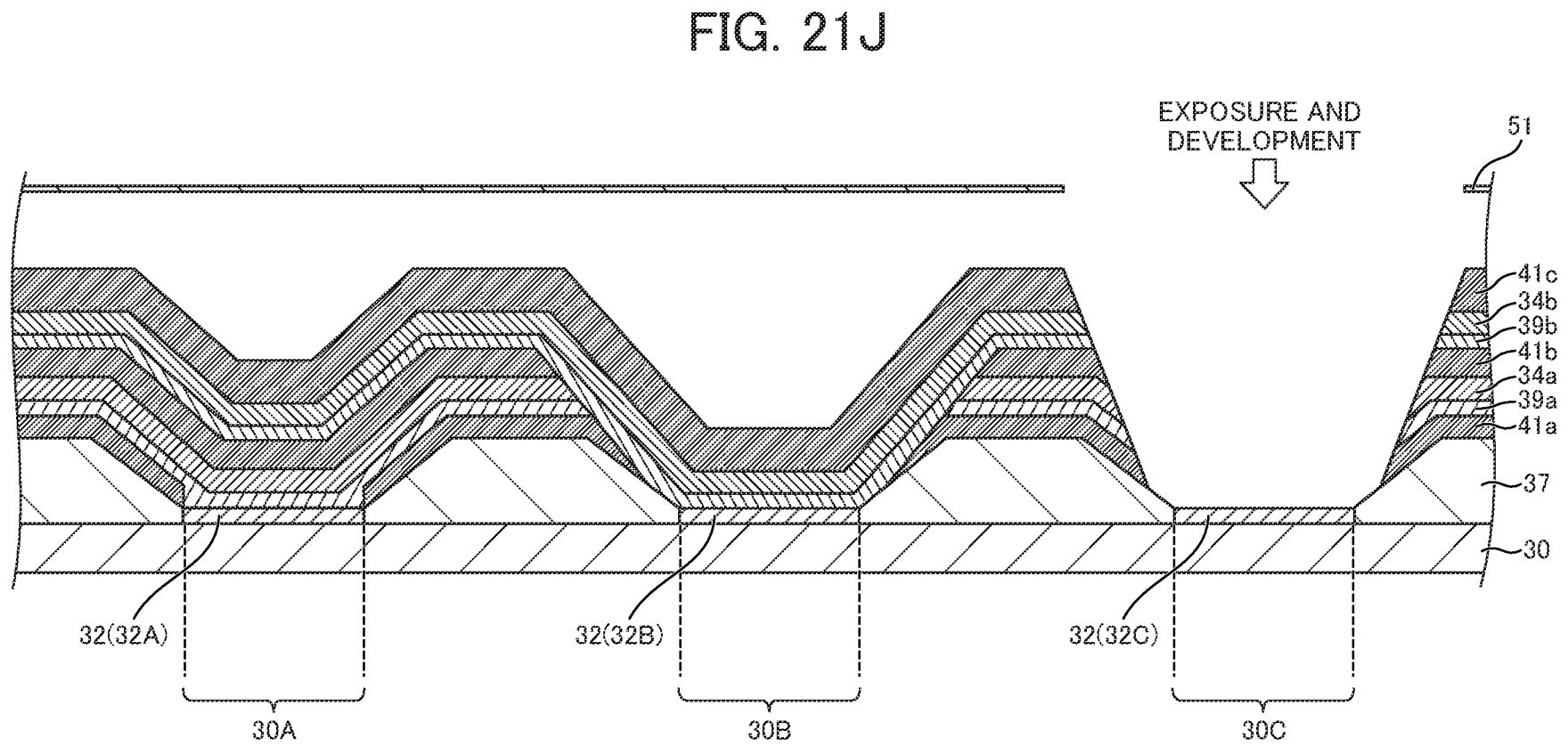

As shown in FIG. 20 and FIG. 21J, the next is removing, through exposure and development, the first resist layer 41_a_ formed over the third region 30C of the substrate 30. The following (Step S80, step v)) is patterning the third resist layer 41_c_ by lifting off the first charge-transport material layer 39_a_, first light-emitting material layer 34_a_, second resist layer 41_b_, second charge-transport material layer 39_b_, second light-emitting material layer 34_b_, and third resist layer 41_c_ formed over the first resist layer 41_a_ that is removed.

Step S80 is followed by a process step (Step S81, step w)) of forming a third charge-transport material layer 39_c_ over the substrate 30 provided with the third resist layer 41_c_ having a pattern shape with the portion corresponding to the third region 30C being removed.

Figure 21K:
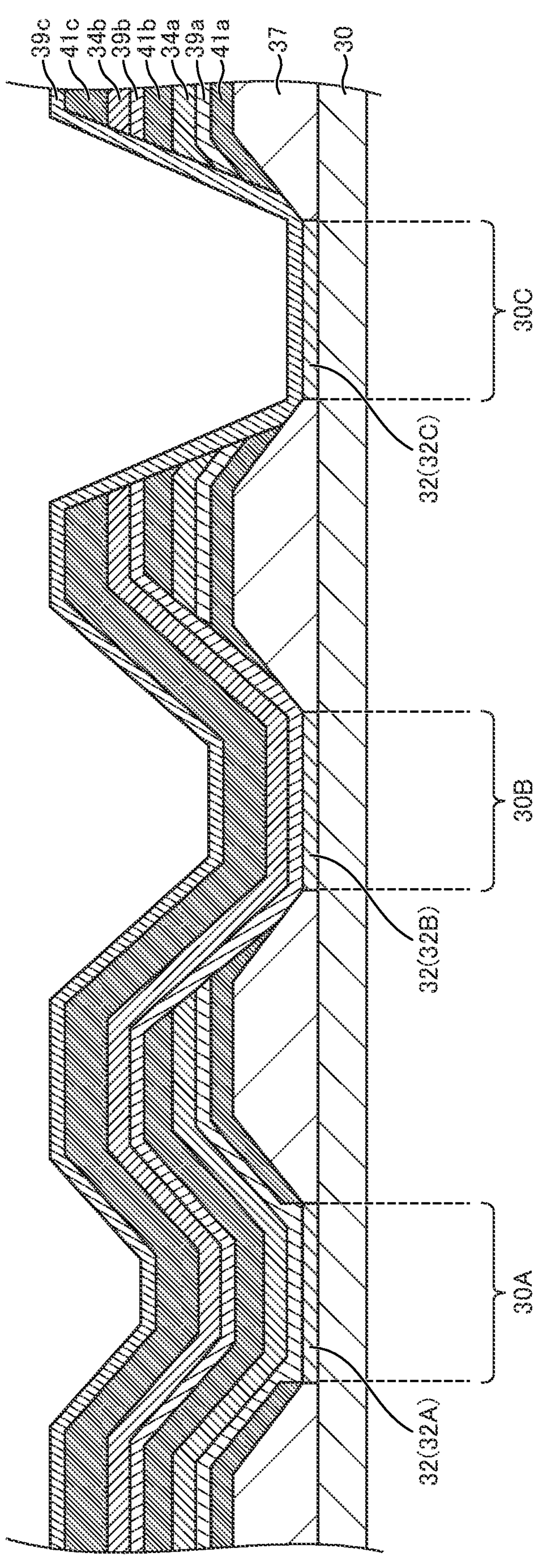
FIG. 21K is a schematic sectional view of the intermediate product of the display device according to the second embodiment.
Figure 21L:
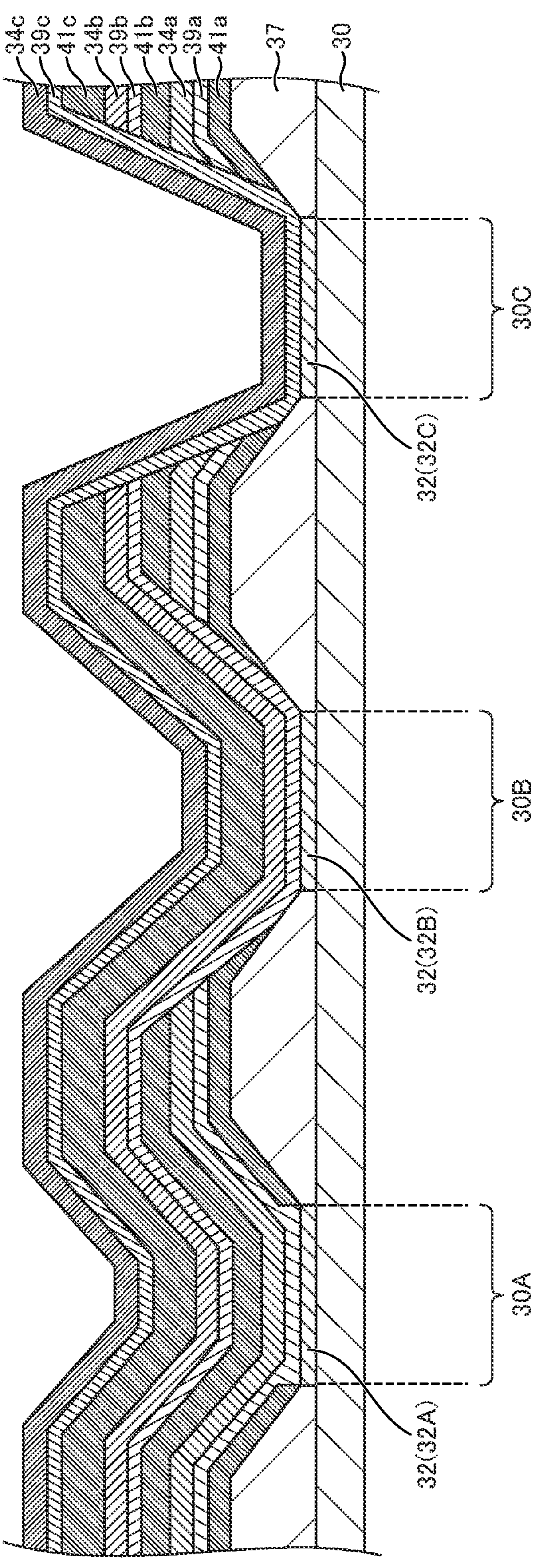
FIG. 21L is a schematic sectional view of the intermediate product of the display device according to the second embodiment.

That is, as illustrated in FIG. 21K, the third charge-transport material layer 39_c_ is formed over the exposed third pixel electrode 32C above the third region 30C of the substrate 30 with the first resist layer 41_a_ removed, and over the patterned third resist layer 41_c_. As shown in FIG. 20 and FIG. 21L, the next (Step S82, step x)) is forming the third light-emitting material layer 34_c_ by applying a third light-emitting material containing quantum dots over the third charge-transport material layer 39_c_.

Figure 21M:
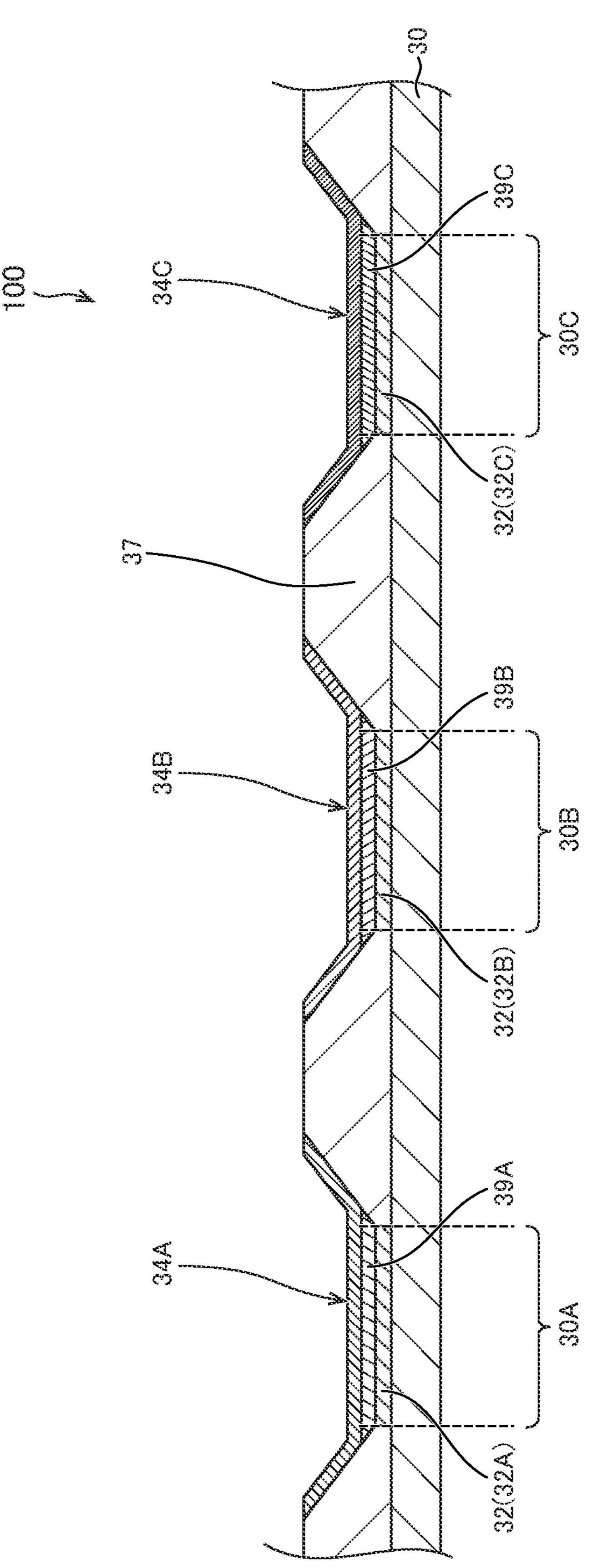
FIG. 21M is a schematic sectional view of the intermediate product of the display device according to the second embodiment.

As shown in FIG. 20 and FIG. 21M, Step S82 is followed by removing, through exposure and development, the second resist layer 41_b_ formed over the first light-emitting material layer 34_a_ located in correspondence with the first region 30A. The following is lifting off the second charge-transport material layer 39_b_, second light-emitting material layer 34_b_, third resist layer 41_c_, third charge-transport material layer 39_c_, and third light-emitting material layer 34_c_ formed over the second resist layer 41_b_ that is removed, to produce the first individualized charge transport layer 39A that is the first charge-transport material layer 39_a_ formed over the first region 30A, and to produce the first light-emitting layer 34A that is the first light-emitting material layer 34_a_ formed over the first region 30A.

In addition, the third resist layer 41_c_ formed over the second light-emitting material layer 34_b_ located in correspondence with the second region 30B undergoes removal through exposure and development. The following is lifting off the third charge-transport material layer 39_c_ and third light-emitting material layer 34_c_ formed over the third resist layer 41_c_ that is removed, to produce the second individualized charge transport layer 39B that is the second charge-transport material layer 39_b_ formed over the second region 30B, and to produce the second light-emitting layer 34B that is the second light-emitting material layer 34_b_ formed over the second region 30B.

This process step (Step S83, step y)) also includes producing the third individualized charge transport layer 39C that is the third charge-transport material layer 39_c_ formed over the third light-emitting material layer 34_c_ located in correspondence with the third region 30C, and producing the third light-emitting layer 34C that is the third light-emitting material layer 34*c* formed over this third light-emitting material layer 34*c*. Step S83 also includes, as illustrated in FIG. 21M, removing the stack consisting of the first resist layer 41*a*, first charge-transport material layer 39*a*, first light-emitting material layer 34*a*, second resist layer 41*b*, second charge-transport material layer 39*b*, second light-emitting material layer 34*b*, third resist layer 41*c*, third charge-transport material layer 39*c*, and third light-emitting material layer 34*c* formed over the bank 37.

In the foregoing way, the first individualized charge transport layer 39A, the second individualized charge transport layer 39B, the third individualized charge transport layer 39C, the first light-emitting layer 34A, the second light-emitting layer 34B, and the third light-emitting layer 34C are formed.

It is noted that although Step S83 above includes removing the stack formed over the bank 37, the stack may remain over the bank 37 to be used as part of the bank 37.

Further, although the foregoing has described a step of forming the light-emitting layers 34 and individualized charge transport layers 39 with regard to the display device 100 provided with the pixel 11 including three subpixels 21, the pixel 11 may include two subpixels 21. The light-emitting layers 34 and individualized charge transport layers 39 of the display device 100 provided with the pixel 11 including two subpixels 21 are formed through the following process steps.

That is, Step S78 shown in FIG. 20 is followed by removing, through exposure and development, the second resist layer 41*b* formed over the first light-emitting material layer 34*a* above the first region 30A. The next is lifting off the second charge-transport material layer 39*b* and second light-emitting material layer 34*b* formed over the second resist layer 41*b* that is removed, to produce the first individualized charge transport layer 39A that is the first charge-transport material layer 39*a* formed above the first region 30A, and to produce the first light-emitting layer 34A that is the first light-emitting material layer 34*a* formed above the first region 30A. In addition, the second charge-transport material layer 39*b* formed above the second region 30B constitutes the second individualized charge transport layer 39B, and the second light-emitting material layer 34*b* formed above the second region 30B constitutes the second light-emitting layer 34B. Through the foregoing process steps, each light-emitting layer and each charge transport layer are formed (step t)).

Further, the first individualized charge transport layer 39A may contain a first nanoparticle, the second individualized charge transport layer 39B may contain a second nanoparticle, and the third individualized charge transport layer 39C may contain a third nanoparticle. In such a case where the first individualized charge transport layer 39A, the second individualized charge transport layer 39B, and the third individualized charge transport layer 39C each contain a nanoparticle, the ratio of ligands coordinating with the individual first nanoparticle, second nanoparticle, and third nanoparticle preferably establishes the following relationship. That is, the ratio of ligands coordinating with the second nanoparticle is preferably smaller than the ratio of ligands coordinating with the first nanoparticle, and ligands coordinating with the third nanoparticle.

That is, the presence of ligands within the individualized charge transport layer 39 hinders the permeation of the developing solution. Accordingly, to promote the permeation of the developing solution, the ratio of ligands contained in the individualized charge transport layer 39 is preferably small.

By the way, in the step of forming the light-emitting layers 34 and the individualized charge transport layers 39 according to the second embodiment, removing the first resist layer 41*a* corresponding to the third region 30C for liftoff in Step S80 offers a stack having the most layers as the result of the liftoff removal. Alternatively, removing the second resist layer 41*b* corresponding to the first region 30A for liftoff in Step S83 offers a stack having the most layers. In these two cases, a charge-transport material layer included in the removed stack is the second charge-transport material layer 39*b*, which constitutes the second individualized charge transport layer 39B.

Accordingly, setting the ratio of ligands coordinating with the second quantum dot contained in the second charge-transport material layer 39*b*, constituting the second individualized charge transport layer 39B, to be smaller than the ratio of ligands coordinating with the first quantum dot, and ligands coordinating with the third quantum dot can reduce the hindrance to the permeation of the developing solution in a case where the stack that undergoes liftoff removal has the most layers.

Consequently, the stack's detachability from the substrate 30 can be improved in the step of forming the light-emitting layers 34 and the individualized charge transport layers 39 according to the second embodiment even in a case where the stack that undergoes liftoff removal has the most layers.

Third Embodiment

Figure 22:
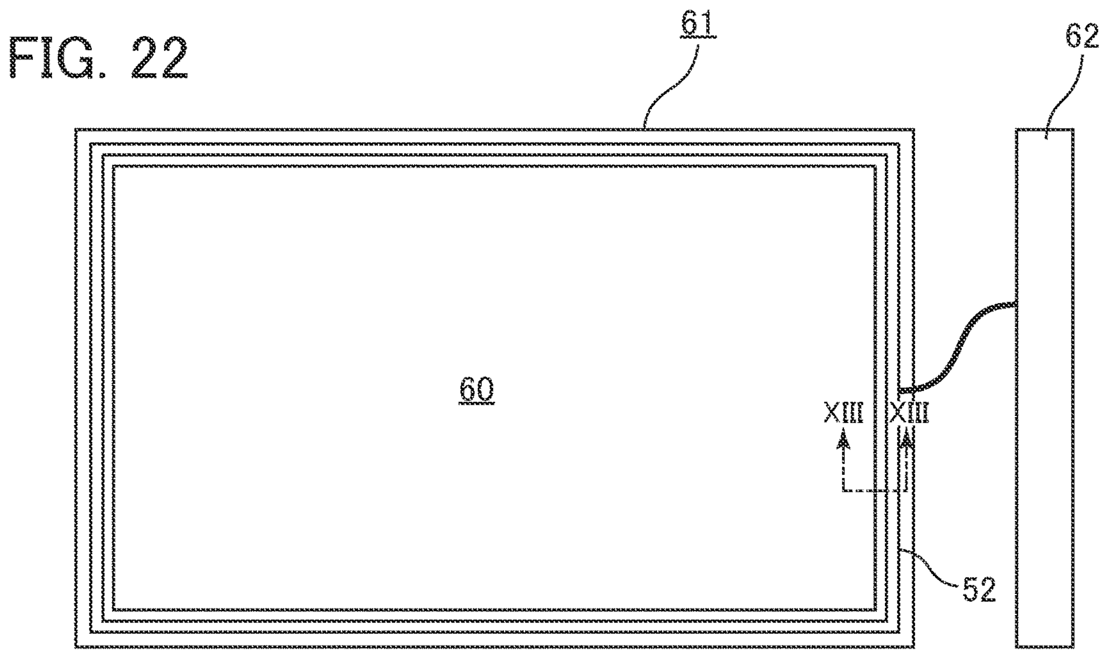
FIG. 22 is a schematic plan view of the configuration of the display region of a display device according to a third embodiment, and of the configuration of a frame region surrounding the perimeter of the display region.
Figure 23:
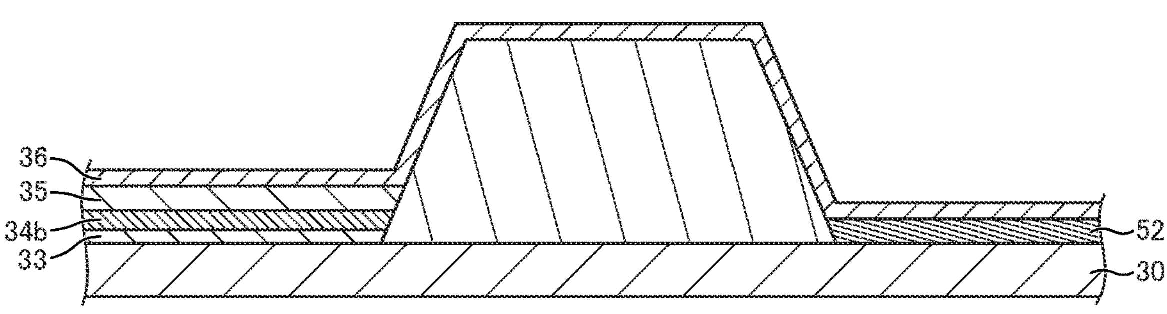
FIG. 23 is a sectional view of the display device taken along line XXIII-XXIII in FIG. 22.
Figure 24:
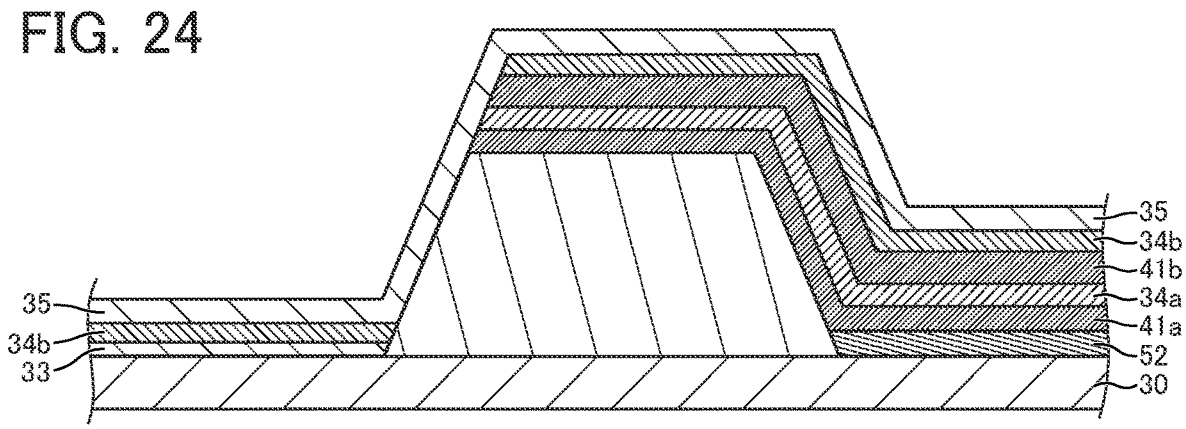
FIG. 24 is a schematic sectional view of the intermediate product taken along line XIII-XIII in FIG. 23.

A display device 200 according to a third embodiment will be described with reference to FIG. 22 to FIG. 24. FIG. 22 is a schematic plan view of the configuration of the display region 60 of the display device 200 according to the third embodiment, and of the configuration of a frame region 61 surrounding the perimeter of the display region 60. FIG. 23 is a sectional view of the display device 200 taken along line XXIII-XXIII in FIG. 22. FIG. 24 is a schematic sectional view of the intermediate product taken along line XIII-XIII in FIG. 23.

The configuration of the light-emitting element layer 31 in the display region 60 of the display device 200 according to the third embodiment is similar to that of the display device 1 according to the first embodiment. Thus, the same components will be denoted by similar signs, and their description will be omitted. Further, with regard to the method for forming the light-emitting element layer 31, the display device 200 according to the third embodiment is similar to the display device 1 according to the first embodiment. Thus, the description of the method for forming the light-emitting element layer 31 will be omitted. Then, only a method for forming a common-electrode contact portion 52, which will be described later on, will be described.

In the display device 200 according to the third embodiment, the frame region 61 is formed around the perimeter of the display region 60, as illustrated in FIG. 22 and FIG. 23. The common-electrode contact portion 52, where the common electrode 36 and an external power source 62 are connected together, is provided in the frame region 61. That is, the common electrode 36 is provided astride both of the display region 60 and frame region 61. Then, the common electrode 36 in the frame region 61 is electrically connected to the common-electrode contact portion 52. On the other hand, the first common charge transport layer 33 is not provided in the frame region 61.

By the way, the first embodiment has described the method for forming the light-emitting element layer 31 in the display region 60 of the display device 1. The step of forming the light-emitting layers 34 in the method for forming the light-emitting element layer 31 includes forming the first resist layer 41*a*, the second resist layer 41*b*, the first light-emitting material layer 34*a*, and the second light-emitting material layer 34*b* all over a region including the first region 30A, second region 30B, and bank 37 on the substrate 30, and finally removing the first resist layer 41*a* or second resist layer 41*b* for liftoff, to thus form the first light-emitting layer 34A and the second light-emitting layer 34B.

In the third embodiment, the step of forming the light-emitting layers 34 includes forming the first resist layer 41*a*, the second resist layer 41*b*, the first light-emitting material layer 34*a*, and the second light-emitting material layer 34*b* over the common-electrode contact portion 52 in addition to over the region including the first region 30A, second region 30B, and bank 37 of the substrate 30.

After forming the second common charge transport layer 35 in Step S16 of the method for forming the light-emitting element layer 31 shown in FIG. 4, the next is removing the first resist layer 41*a*, second resist layer 41*b*, first light-emitting material layer 34*a*, and second light-emitting material layer 34*b* formed over the common-electrode contact portion 52. That is, after the formation of the second common charge transport layer 35, and before the formation of the common electrode 36 in Step S17 in FIG. 4, the first resist layer 41*a* formed over the common-electrode contact portion 52 undergoes removal through exposure and development. The next is lifting off the first light-emitting material layer 34*a*, second resist layer 41*b*, second light-emitting material layer 34*b*, and second common charge transport layer 35 stacked over the removed first resist layer 41*a*.

Thereafter, in the region where the common-electrode contact portion 52 is formed, the common electrode 36 is formed so as to be in contact with the common-electrode contact portion 52.

In this way, leaving the insulating first resist layer 41*a* and the insulating second resist layer 41*b* over the common-electrode contact portion 52 until forming the common electrode 36 can avoid current leakage from the pixel electrodes 32 through the first common charge transport layer 33 to the common-electrode contact portion 52.

The invention claimed is:

1. A method for manufacturing a display device, the method comprising:

forming a first resist layer over a substrate;

patterning the first resist layer by removing, through exposure and development, the first resist layer formed above a first region of the substrate;

forming a first light-emitting material layer over the patterned first resist layer and above the first region of the substrate with the first resist layer removed;

forming a second resist layer over the first light-emitting material layer;

patterning the second resist layer by removing, through exposure and development, the first resist layer formed above a second region of the substrate, followed by lifting off the first light-emitting material layer and the second resist layer formed over the first resist layer above the second region; and forming a second light-emitting material layer over the patterned second resist layer and above the second region of the substrate.

2. The method according to claim 1, further comprising:

after forming the second light-emitting layer, forming light-emitting layers by removing, through exposure and development, the second resist layer formed over the first light-emitting material layer above the first region of the substrate, followed by lifting off the second light-emitting material layer formed over the second resist layer above the first region, to produce a first light-emitting layer that is the first light-emitting material layer formed over the first region, and to produce a second light-emitting layer that is the second light-emitting material layer formed over the second region.

3. The method according to claim 1, further comprising:

after forming the second light-emitting layer-step f), forming a third resist layer over the second light-emitting material layer;

patterning the third resist layer by removing, through exposure and development, the first resist layer formed above a third region of the substrate, followed by lifting off the first light-emitting material layer, the second resist layer, the second light-emitting material layer, and the third resist layer formed over the first resist layer above the third region; and forming a third light-emitting material layer over the patterned third resist layer and above the third region of the substrate with the first resist layer removed.

4. The method according to claim 3, further comprising:

after forming the third light-emitting material layer, forming light-emitting layers individually by removing, through exposure and development, the second resist layer formed over the first light-emitting material layer above the first region of the substrate, followed by lifting off the second light-emitting material layer, the third resist layer, and the third light-emitting material layer formed over the second resist layer above the first region, and by removing, through exposure and development, the third resist layer formed over the second light-emitting material layer above the second region of the substrate, followed by lifting off the third light-emitting material layer formed over the third resist layer above the second region, to produce a first light-emitting layer that is the first light-emitting material layer formed over the first region, to produce a second light-emitting layer that is the second light-emitting material layer formed over the second region, and to produce a third light-emitting layer that is the third light-emitting material layer formed over the third region.

5. The method according to claim 4, wherein a developing solution, that is used in patterning the third resist layer, is an alkaline developing solution having an alkali concentration that enables liftoff of the first light-emitting material layer, the second resist layer, the second light-emitting material layer, and the third resist layer formed over the first resist layer in the third region.

6. The method according to claim 4, wherein patterning the third resist layer is performed through spray development, spin development, or ultrasonic development.

7. The method according to claim 4, wherein the first resist layer, that is removed in the liftoff in each of patterning the second resist layer and patterning the third resist layer, and the second and third resist layers, that are removed in the liftoff in forming the individual light-emitting layers, are formed so as to have an invertedly tapered shape tapering down toward the substrate.

8. The method according to claim 4, wherein a liquid-repellent layer containing a liquid-repellent ingredient is formed on an upper surface of each of the first resist layer, the second resist layer, and the third resist layer.

9. The method according to claim 4, wherein;

above the substrate, a bank, defining ends of light-emitting regions where light is emitted in the first, second, and third light-emitting layers, is provided upright, and each of the first resist layer, the second resist layer, and the third resist layer is thicker than the bank.

10. The method according to claim 4, wherein the third resist layer is thicker than the second resist layer, which is thicker than the first resist layer.

11. The method according to claim 4, wherein the first light-emitting layer contains a first quantum dot, the second light-emitting layer contains a second quantum dot, the third light-emitting layer contains a third quantum dot, and a ratio of ligands coordinating with the second quantum dot is smaller than a ratio of ligands coordinating with the first quantum dot and the ligands coordinating with the third quantum dot.

12. The method according to claim 11, wherein the second light-emitting layer is a light-emitting layer that emits red light.

13. The method according to claim 11, wherein at least one of the first quantum dot, the second quantum dot, and the third quantum dot contains indium phosphide.

14. A method for manufacturing a display device, the method comprising:

forming a first resist layer over a substrate;

patterning the first resist layer by removing, through exposure and development, the first resist layer formed above a first region of the substrate;

forming a first charge-transport material layer over the patterned first resist layer and above the first region of the substrate with the first resist layer removed;

forming a first light-emitting material layer over the first charge-transport material layer;

forming a second resist layer over the first light-emitting material layer;

patterning the second resist layer by removing, through exposure and development, the first resist layer formed above a second region of the substrate, followed by lifting off the first charge-transport material layer, the first light-emitting material layer, and the second resist layer formed over the first resist layer above the second region;

forming a second charge-transport material layer over the patterned second resist layer and above the second region of the substrate with the first resist layer removed; and forming a second light-emitting material layer over the second charge-transport material layer.

15. The method according to claim 14, further comprising:

after forming the second light-emitting material layer, forming a third resist layer over the second light-emitting material layer;

patterning the third resist layer by removing, through exposure and development, the first resist layer formed over a third region of the substrate, followed by lifting off the first charge-transport material layer, the first light-emitting material layer, the second resist layer, the second charge-transport material layer, the second light-emitting material layer, and the third resist layer formed above the third region;

forming a third charge-transport material layer over the patterned third resist layer and above the third region of the substrate; and forming a third light-emitting material layer over the third charge-transport material layer.

16. The method according to claim 15, further comprising:

after forming the third light-emitting material layer, forming light-emitting layers and charge transport layers individually by removing, through exposure and development, the second resist layer formed over the first light-emitting material layer above the first region of the substrate, followed by lifting off the second charge-transport material layer, the second light-emitting material layer, the third resist layer, the third charge-transport material layer, and the third light-emitting material layer formed over the second resist layer above the first region, and by removing, through exposure and development, the third resist layer formed over the second light-emitting material layer above the second region of the substrate, followed by lifting off the third charge-transport material layer and the third light-emitting material layer formed over the third resist layer above the second region, to produce a first light-emitting layer and a first individualized charge transport layer that are the first light-emitting material layer and the first charge-transport material layer formed above the first region, to produce a second light-emitting layer and a second individualized charge transport layer that are the second light-emitting material layer and the second charge-transport material layer formed above the second region, and to produce a third light-emitting layer and a third individualized charge transport layer that are the third light-emitting material layer and the third charge-transport material layer formed above the third region, wherein:

the first individualized charge transport layer contains a first nanoparticle, the second individualized charge transport layer contains a second nanoparticle, the third individualized charge transport layer contains a third nanoparticle, and a ratio of ligands coordinating with the second nanoparticle is smaller than a ratio of ligands coordinating with the first nanoparticle and the ligands coordinating with the third nanoparticle.

17. A display device comprising:

a plurality of pixel electrodes disposed in correspondence with a plurality of subpixel formation regions;

a first common charge transport layer provided over the plurality of pixel electrodes;

a first light-emitting layer and a second light-emitting layer, each provided, over the first common charge transport layer, in a location facing a corresponding one of the plurality of pixel electrodes;

a bank provided upright so as to define ends of light-emitting regions where light is emitted in the first and second light-emitting layers;

a common electrode provided over both of the first light-emitting layer and the second light-emitting layer, the first common charge transport layer and the common electrode being disposed over the bank; and a resist layer provided in a location overlapping the bank in a plan view, and between the first common charge transport layer and the common electrode.

18. The display device according to claim 17, wherein a stack including the first light-emitting layer, the second light-emitting layer, and the resist layer is formed over the bank, and the resist layer is disposed between the first common charge transport layer and the first and second light-emitting layers.

19. The display device according to claim 17, further comprising:

an effective display region; and a frame region disposed around the effective display region, wherein the first common charge transport layer is not provided in the frame region.

20. The display device according to claim 19, wherein the common electrode is disposed astride both of the effective display region and the frame region, and the frame region includes a connecting portion connecting together a wire connected to an external power source and the common electrode.

* * * * *